(12) United States Patent
Sogo et al.

(10) Patent No.: US 9,385,279 B2
(45) Date of Patent: Jul. 5, 2016

(54) LIGHT-EMITTING DEVICE AND METHOD FOR MANUFACTURING THE SAME

(71) Applicant: NICHIA CORPORATION, Anan-shi (JP)

(72) Inventors: Takayuki Sogo, Anan (JP); Takanobu Sogai, Anan (JP); Hisashi Kasai, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/723,463

(22) Filed: May 28, 2015

(65) Prior Publication Data

US 2015/0349207 A1    Dec. 3, 2015

(30) Foreign Application Priority Data

May 30, 2014 (JP) .................................. 2014-112033
Jun. 24, 2014 (JP) .................................. 2014-129134

(51) Int. Cl.
| | | |
|---|---|---|
| *H01L 33/36* | (2010.01) | |
| *H01L 33/38* | (2010.01) | |
| *H01L 33/52* | (2010.01) | |
| *H01L 33/00* | (2010.01) | |
| *H01L 33/54* | (2010.01) | |
| *H01L 33/62* | (2010.01) | |

(52) U.S. Cl.
CPC .......... *H01L 33/382* (2013.01); *H01L 33/0079* (2013.01); *H01L 33/0095* (2013.01); *H01L 33/385* (2013.01); *H01L 33/52* (2013.01); *H01L 33/54* (2013.01); *H01L 33/62* (2013.01); *H01L 2933/005* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2006/0022320 A1 | 2/2006 | Nakanishi et al. | |
| 2011/0175860 A1* | 7/2011 | Kojima | H01L 33/54 |
| | | | 257/99 |
| 2011/0220910 A1 | 9/2011 | Kojima et al. | |
| 2011/0297998 A1 | 12/2011 | Akimoto et al. | |

FOREIGN PATENT DOCUMENTS

| | | |
|---|---|---|
| JP | 2006-41401 | 2/2006 |
| JP | 2011-187679 | 9/2011 |
| JP | 2011-253998 | 12/2011 |
| JP | 2011-258667 | 12/2011 |
| JP | 2011-258802 | 12/2011 |

* cited by examiner

*Primary Examiner* — Fei Fei Yeung Lopez
(74) *Attorney, Agent, or Firm* — Mori & Ward, LLP

(57) ABSTRACT

A light-emitting device includes a semiconductor light-emitting element, a first resin layer, a first metallic layer, a second resin layer, and a second metallic layer. The semiconductor light-emitting element includes a semiconductor stacked body and an electrode provided on one side of the semiconductor stacked body. The second resin layer is provided on the first resin layer and has a lower surface in contact with the first resin layer and an upper surface opposite to the lower surface. The second metallic layer is provided in the second resin layer and has a metallic lower surface and a metallic upper surface opposite to the metallic lower surface. The metallic upper surface is exposed from the second resin layer. The metallic upper surface of the second metallic layer is at least partially lower in height from the semiconductor stacked body than the upper surface of the second resin layer.

16 Claims, 20 Drawing Sheets

LIGHT-EMITTING DEVICE AND METHOD FOR MANUFACTURING THE SAME

CROSS-REFERENCE TO RELATED APPLICATIONS

The present application claims priority under 35 U. S. C. §119 to Japanese Patent Application No. 2014-112033, filed May 30, 2014 and Japanese Patent Application No. 2014-129134, filed Jun. 24, 2014. The contents of these applications are incorporated herein by reference in their entirety.

BACKGROUND

1. Technical Field

The present disclosure relates to a light-emitting device and a method for manufacturing a light-emitting device.

2. Discussion of the Background

Light-emitting devices that use semiconductor light-emitting elements such as light-emitting diodes are widely used, because the devices easily achieve reductions in size, and achieve high luminous efficiency.

The light-emitting devices that use semiconductor light-emitting elements are classified roughly into two types of: face-up type in which there are surfaces of the semiconductor light-emitting elements provided with pad electrodes on the side opposite to a mounting substrate; and face-down type in which there are electrodes provided on the lower surfaces of the semiconductor light-emitting elements as surfaces opposed to a mounting substrate.

In the case of the face-up type, semiconductor light-emitting elements are mounted on leads or the like, and the semiconductor light-emitting elements and the leads are connected to each other with bonding wires or the like. For this reason, in the case of a planar view from a direction perpendicular to the surface of the mounting substrate mounted with the elements, there is a need to locate the bonding wires partially outside the semiconductor light-emitting elements, and there is a limit on the reduction in size.

On the other hand, in the face-down type (flip-chip type), in the case of a planar view of pad electrodes provided on the surfaces of the semiconductor light-emitting elements and wiring provided on the mounting substrate from a direction perpendicular to the surface of the mounting substrate, electrical connections are possible with connecting parts such as bumps or metal pillars located within the range of the semiconductor light-emitting element size.

Thus, a CSP (Chip Size Package or Chip Scale Package) can be achieved which has a light-emitting device reduced in size (particularly, size in planar view from a direction perpendicular to a mounting substrate) to a level closer to a chip size of light-emitting elements.

Then, recently, in order to advance further reductions in size, or in order to further increase the luminous efficiency, face-down light-emitting devices are used which have growth substrates (light-transmissive substrates) such as sapphire removed or reduced in thickness.

The growth substrates refer to substrates used to grow thereon n-type semiconductor layers and p-type semiconductor layers constituting light-emitting elements, and also have the effect of supporting the semiconductor light-emitting elements which are small in thickness and low in strength, thereby improving the strength of the light-emitting device.

For this reason, a light-emitting device with a growth substrate removed or a light-emitting device with a grown substrate reduced in thickness after the formation of semiconductor light-emitting elements is configured to have a resin layer provided on the electrode side (on the side opposite to a mounting substrate) in order to support the semiconductor light-emitting elements, and have electrodes and external terminals electrically connected by forming internal wiring composed of metal pillars or other wiring so as to penetrate the resin layer, as described in, for example, Japanese Unexamined Patent Application Publication No. 2011-187679.

The light-emitting device can ensure sufficient strength, with the resin layer including the internal wiring.

SUMMARY OF THE INVENTION

According to one aspect of the present invention, a light-emitting device includes a semiconductor light-emitting element, a first resin layer, a first metallic layer, a second resin layer, and a second metallic layer. The semiconductor light-emitting element includes a semiconductor stacked body and an electrode provided on one side of the semiconductor stacked body. The first resin layer is provided on the one side of the semiconductor stacked body to cover the electrode. The first metallic layer is provided in the first resin layer and electrically connected to the electrode. The second resin layer is provided on the first resin layer and has a lower surface in contact with the first resin layer and an upper surface opposite to the lower surface. The second metallic layer is provided in the second resin layer and has a metallic lower surface and a metallic upper surface opposite to the metallic lower surface. The metallic lower surface is electrically connected to the first metallic layer. The metallic upper surface is exposed from the second resin layer. The metallic upper surface of the second metallic layer is at least partially lower in height from the semiconductor stacked body than the upper surface of the second resin layer.

According to another aspect of the present invention, a method for manufacturing a light-emitting device includes preparing a wafer including arranged semiconductor light-emitting elements each of which has a semiconductor stacked body and an electrode provided on one side of the semiconductor stacked body. A first resin layer having a first opening is provided on the one side of the semiconductor stacked body. A first metallic layer is provided in the first opening of the first resin layer to be electrically connected to the electrode. A second resin layer having a second opening is provided on the first resin layer. The second resin layer has a lower surface in contact with the first resin layer and an upper surface opposite to the lower surface. A second metallic layer is provided in the second opening of the second resin layer. The second metallic layer has a metallic lower surface and a metallic upper surface opposite to the metallic lower surface. The metallic lower surface is electrically connected to the first metallic layer. The metallic upper surface is exposed from the second resin layer. The metallic upper surface of the second metallic layer is at least partially lower in height from the semiconductor stacked body than the upper surface of the second resin layer. The wafer is cut along a boundary line between the arranged semiconductor light-emitting elements to divide the arranged semiconductor light-emitting elements.

According to further aspect of the present invention, a light-emitting device includes a semiconductor light-emitting element, a first resin layer, a first metallic layer, a second resin layer, and a second metallic layer. The semiconductor light-emitting element includes a semiconductor stacked body and an electrode provided on one side of the semiconductor stacked body. The first resin layer is provided on the one side of the semiconductor stacked body to cover the electrode and has a first lower surface in contact with the electrode and a first upper surface opposite to the first lower surface. The first resin layer has a first side surface extending from the first upper surface to the first lower surface. The first metallic layer is provided in the first resin layer and electrically connected to the electrode. The second resin layer is provided on the first resin layer and has a second lower surface in contact with the first upper surface of the first resin layer and a second upper surface opposite to the second lower surface of the second resin layer. The second resin layer has a second side surface extending from the second upper surface to the second lower surface of the second resin layer. The second side surface of the second resin layer is provided inside the first side surface of the first resin layer in planar view. The second metallic layer is provided in the second resin layer and has a metallic lower surface and a metallic upper surface opposite to the metallic lower surface. The metallic lower surface is electrically connected to the first metallic layer. The metallic upper surface of the second metallic layer is exposed from the second resin layer.

According to the other aspect of the present invention, a method for manufacturing a light-emitting device includes preparing a wafer including arranged semiconductor light-emitting elements each of which has a semiconductor stacked body and has an electrode provided on one side of the semiconductor stacked body. A first resin layer having a first opening, a first lower surface in contact with the electrode, and a first upper surface opposite to the first lower surface is provided on the one side of the semiconductor stacked body. The first resin layer has a first side surface extending from the first upper surface to the first lower surface. A first metallic layer is provided in the first opening of the first resin layer to be electrically connected to the electrode. A photosensitive resin material is provided on the first resin layer to provide a second resin layer from the photosensitive resin material using a photolithography method. The second resin layer has a second opening, a second lower surface in contact with the first upper surface of the first resin layer, and a second upper surface opposite to the second lower surface of the second resin layer. The second resin layer has a second side surface extending from the second upper surface to the second lower surface of the second resin layer. The second side surface of the second resin layer is provided inside the first side surface of the first resin layer in planar view. A second metallic layer is provided in the second opening of the second resin layer. The second metallic layer has a metallic lower surface and a metallic upper surface opposite to the metallic lower surface. The metallic lower surface is electrically connected to the first metallic layer. The metallic upper surface of the second metallic layer is exposed from the second resin layer. The wafer is cut along a boundary line between the arranged semiconductor light-emitting elements to divide the arranged semiconductor light-emitting elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a plan view, whereas FIG. 1B is a cross-sectional view of FIG. 1A along the line I-I;

FIG. 3A shows a region in which a p-type semiconductor layer and a cover electrode are arranged, whereas FIG. 3B shows a region in which a light reflection electrode is arranged;

FIG. 4A shows a region in which an interlayer insulating film is arranged, whereas FIG. 4B shows a region in which an n-side electrode a p-side electrode are arranged;

FIG. 5A shows a region in which a first resin layer and a first metallic layer are arranged, whereas FIG. 5B shows a region in which a second resin layer and a second metallic layer are arranged;

FIG. 8A illustrates a semiconductor stacked body formation step, FIG. 8B illustrates a light reflection electrode formation step, FIG. 8C illustrates a cover electrode formation step, FIG. 8D illustrates an n-type semiconductor layer exposure step, and FIG. 8E illustrates an interlayer insulating film formation step;

FIG. 9A is a plan view, whereas FIG. 9B is a cross-sectional view of FIG. 9A along the line II-II;

FIG. 10A is a plan view, whereas FIG. 10B is a cross-sectional view of FIG. 10A along the line II-II;

FIG. 11A is a first resin layer formation step, FIG. 11B is a first metallic layer formation step, and FIG. 11C is a second resin layer formation step;

FIG. 12A is a second metallic layer formation step, and FIG. 12B is a mask removal step;

FIG. 13A is a plan view, whereas FIG. 13B is a cross-sectional view of FIG. 13A along the line II-II;

FIG. 15A is a plan view, whereas FIG. 15B is a cross-sectional view of FIG. 15A along the line I-I;

FIG. 17A is a plan view, whereas FIG. 17B is a cross-sectional view of FIG. 17A along the line I-I;

DESCRIPTION OF THE EMBODIMENTS

Figure 1A:
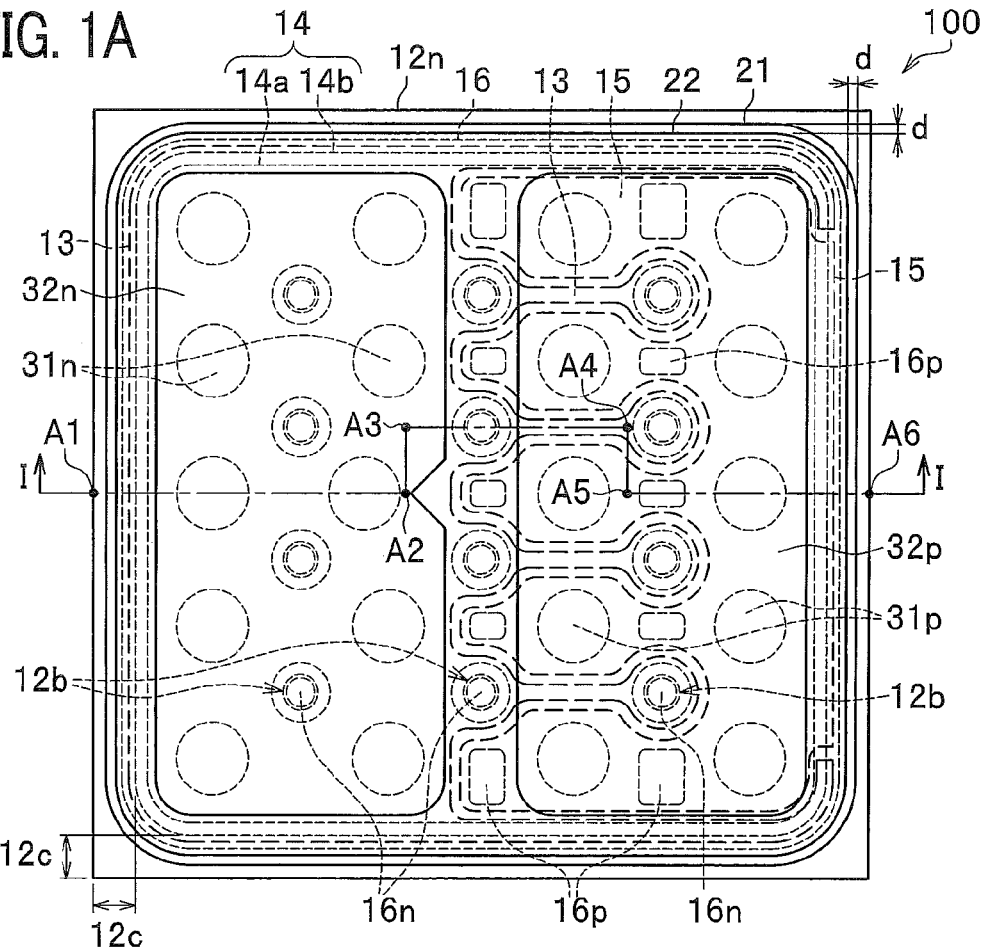
FIGS. 1A and 1B are schematic diagrams illustrating the configuration of a light-emitting device according to a first embodiment of the present invention, where

The embodiments will now be described with reference to the accompanying drawings, wherein like reference numerals designate corresponding or identical elements throughout the various drawings.

Light-emitting devices and manufacturing methods therefor according to the present disclosure will be described below with reference to respective embodiments.

It is to be noted that because the drawings referenced in the following description are intended to schematically illustrate the embodiments of the present invention, the scaling, distance, positional relationship, etc. between respective members may be thus exaggerated, or the members may be partially omitted in the drawings. In addition, the scaling or distance between the respective members may be mismatched among perspective views, plan views, and cross-sectional views. Furthermore, in the following description, the same names and symbols denote the same or like members in principle, and the detailed description will be omitted appropriately.

In addition, the terms "upper", "lower", "left", and "right", etc. are intended to be interchanged depending on circumstances in light-emitting devices according to respective embodiments of the present invention. In this specification, the terms "upper", "lower", etc. are intended to indicate the relative positions between components in the drawings referenced for the purpose of illustration, but not intended to indicate any absolute positions unless otherwise noted.

First Embodiment

Configuration of Light-Emitting Device

First, the configuration of a light-emitting device according to a first embodiment of the present invention will be described with reference to FIGS. 1A through 5B.

Figure 1B:
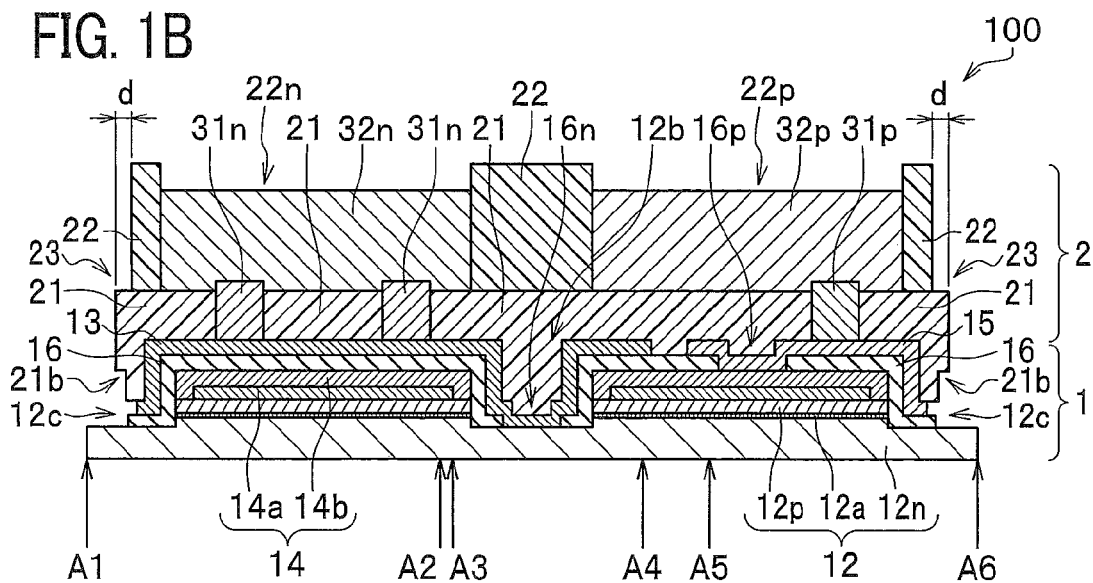

The cross-sectional view shown in FIG. 1B is intended to schematically illustrate a cross section along the line I-I in the plan view shown in FIG. 1A. While the positions A1 to A6 on the line I-I shown in FIG. 1A correspond to the positions A1 to A6 indicated by arrows in FIG. 1B, the figures do not coincide with each other in terms of spacing, because the spacing in the cross-sectional view of FIG. 1B is illustrated by appropriately extending or shortening the spacing (the lengths of members) in the plan view of FIG. 1A, for the sake of clearly illustrating the cross-section structure. In addition, the other cross-sectional views described later are also intended to show cross sections corresponding to the line I-I in the plan view shown in FIG. 1A as in the case of FIG. 1B, unless otherwise noted.

Furthermore, FIG. 3A through 5B show placement regions with hatching for each layer in planar view, for illustrating the stacked structure of the light-emitting device 100 according to the first embodiment.

The light-emitting device 100 according to the first embodiment is outlined substantially in the shape of a square prism as shown in FIGS. 1A to 5B, and is a CSP composed of a semiconductor light-emitting element 1 (hereinafter, referred to as a "light-emitting element" appropriately) that has LED (light-emitting diode) structure with a growth substrate removed, and a support 2 provided on one side of the light-emitting element 1. In addition, as details will be given later, the light-emitting device 100 is a WCSP that is made on a wafer level (a CSP obtained by a wafer process).

The light-emitting element 1 has, on one side thereof (an upper surface in FIG. 1B), an n-side electrode 13 and a p-side electrode 15 provided, and the support 2 is also provided which is obtained by stacking a first resin layer 21 and a second resin layer 22. In addition, the first resin layer 21 and the second resin layer 22 are provided therein with a first metallic layer (n-side first metallic layer) 31$n$ and a first metallic layer (p-side first metallic layer) 31$p$, and a second metallic layer (an n-side second metallic layer) 32$n$ and a second metallic layer (p-side second metallic layer) 32$p$, respectively, as internal wiring. The second metallic layer 32$n$ has continuity to the n-side electrode 13 through the first metallic layer 31$n$, whereas the second metallic layer 32$p$ has continuity to the p-side electrode 15 through the first metallic layer 31$p$, and the upper surfaces of the second metallic layers 32$n$ and 32$p$, which are exposed from the second resin layer 22, serve as mounting surfaces for external electrical connection. In planar view, the second metallic layer 32$n$ and the second metallic layer 32$p$ are partitioned by the second resin layer 22. In addition, the upper surfaces of the second metallic layers 32$n$ and 32$p$ are provided to be lower than the upper surface of the second resin layer 22 in the "level" corresponding to the distance from a semiconductor stacked body 12 in the stacking direction of the semiconductor stacked body 12.

It is to be noted that the lower surface of the light-emitting element 1 serves as a light extraction surface.

Furthermore, a difference 23 with a distance d is provided at the boundary between the first resin layer 21 and the second resin layer 22 so that an outer edge of the second resin layer 22 is located inside an outer edge of the first resin layer 21 in planar view. In addition, the first resin layer 21 has a side surface also provided with a difference 21$b$ so that an outer edge of a lower part is located inside an outer edge of an upper part in planar view.

It is to be noted that while a growth substrate 11 (see FIG. 8A) for use in the formation of the semiconductor stacked body 12 by crystal growth of a semiconductor material is removed from the light-emitting element 1 in the first embodiment, the growth substrate 11 may be left as it is, or reduced in thickness by polishing. In addition, a fluorescent substance layer may be provided on the back side of the semiconductor stacked body 12 after peeling the growth substrate 11, or the back surface of the growth substrate 11.

Next, the configuration of respective members of the light-emitting device 100 will be sequentially described in detail.

The light-emitting element 1 has the shape of a substantially square plate in planar view, which is a face-down LED chip including the n-side electrode 13 and the p-side electrode 15 on one side.

The light-emitting element 1 includes the semiconductor stacked body 12 obtained by stacking an n-type semiconductor layer 12n and a p-type semiconductor layer 12p. The semiconductor stacked body 12 is adapted to emit light by applying an electric current between the n-side electrode 13 and the p-side electrode 15, and an active layer 12a is preferably provided between the n-type semiconductor layer 12n and the p-type semiconductor layer 12p.

Figure 3A:
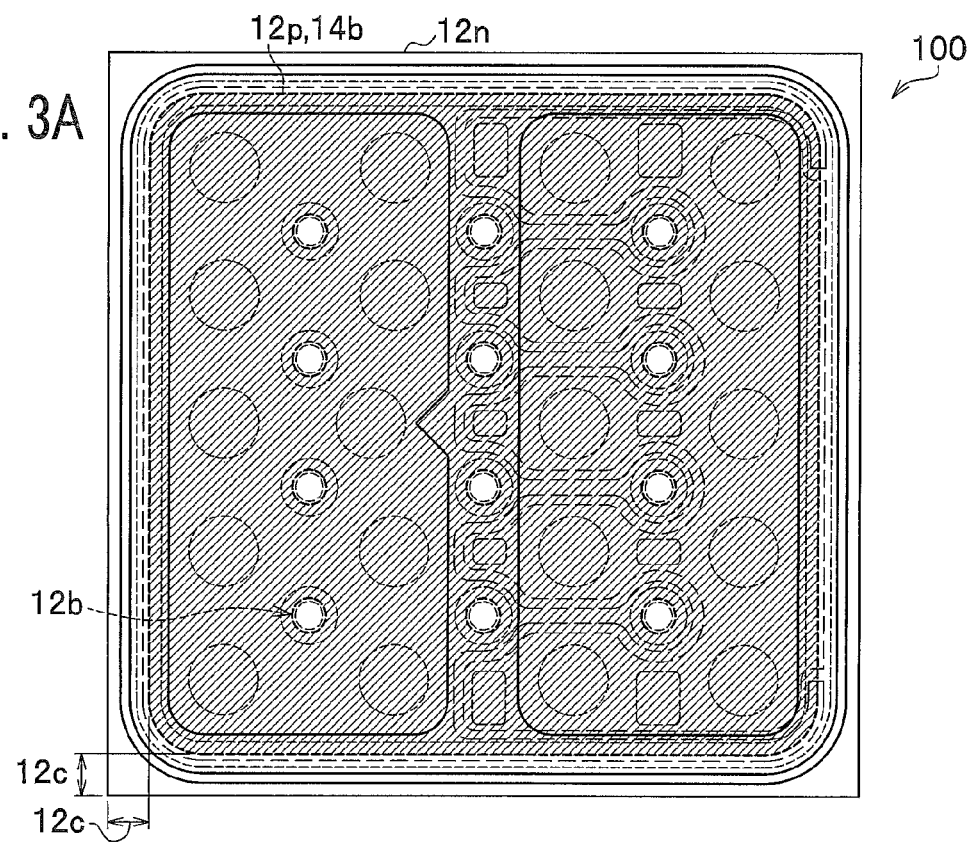
FIGS. 3A and 3B are schematic plan views illustrating the layered structure of the light-emitting device according to the first embodiment of the present invention, where

As shown in FIGS. 1A and 1B and FIG. 3A, the semiconductor stacked body 12 has a region formed partially without the p-type semiconductor layer 12p and the active layer 12a, that is, a region depressed from the surface of the p-type semiconductor layer 12p with the n-type semiconductor layer 12n exposed (this region is referred to as a "first exposed part 12b") formed. The light-emitting element 1 has twelve (four pieces for each of three lines) circular first exposed parts 12b in total in planar view. The bottom of the first exposed part 12b has an interlayer insulating film 16 with an opening 16n formed, and the n-type semiconductor layer 12n and the n-side electrode 13 are electrically connected through the opening 16n of the interlayer insulating film 16.

Furthermore, along the periphery of the semiconductor stacked body 12, a second exposed part 12c is provided which is a region where the n-type semiconductor layer 12n is exposed without the p-type semiconductor layer 12p and the active layer 12a. The second exposed part 12c is provided in a boundary region (dicing street) that is a region along a boundary line 40 (see FIG. 8D) between light-emitting elements 1 in a wafer state, and corresponds to the rest of a region that serves as a cutting width in dividing the light-emitting elements 1 in the wafer state.

It is to be noted that the first exposed part 12b and the second exposed part 12c are entirely or partially coated with the interlayer insulating film 16, the first resin layer 21 and the second resin layer 22, etc. in the completed light-emitting device 100, but referred to as "exposed parts" for descriptive purposes.

In addition, in planar view, a side surface of the semiconductor stacked body 12 corresponding to an outer edge, that is, a side surface of the n-type semiconductor layer 12n corresponding to an outer edge is not coated with either the interlayer insulating film 16 or the first resin layer 21. In a division step S115 (see FIG. 7) that is the last step of a process for manufacturing the light-emitting device 100 by a wafer-level process, the semiconductor stacked body 12 is torn to form the torn surface as a side surface corresponding to an outer edge in a planar view. For this reason, a wide light distribution type light-emitting device can be obtained from the divided light-emitting device 100 with the exposed side surface of the semiconductor stacked body 12 corresponding to an outer edge.

Figure 3B:
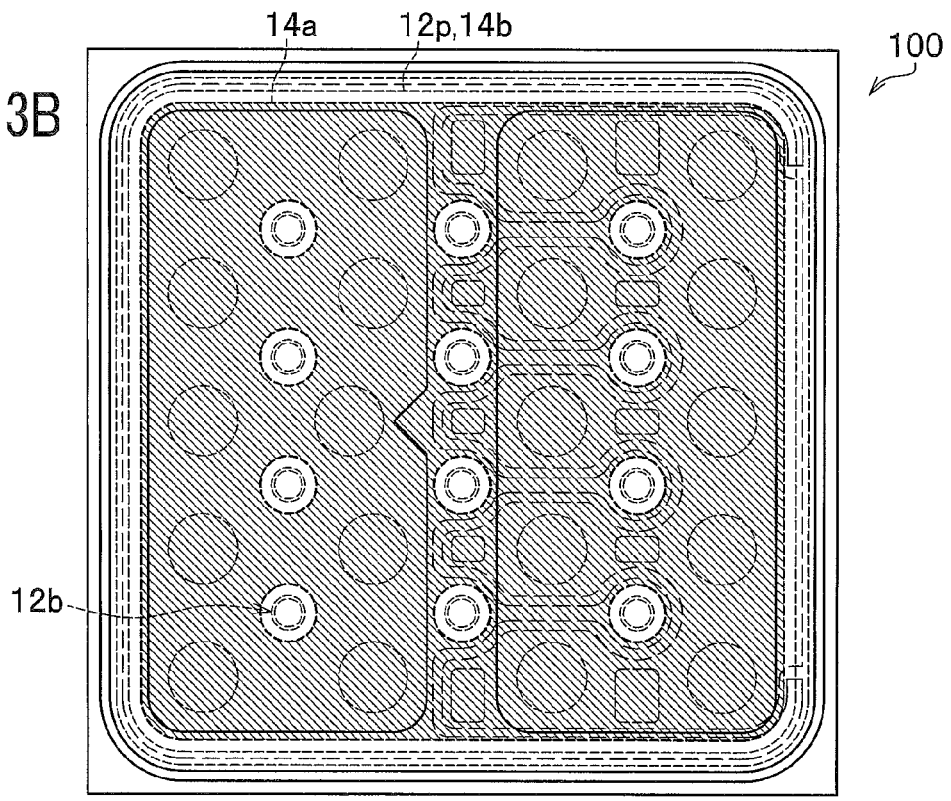

Furthermore, as shown in FIG. 1B, FIG. 3A, and FIG. 3B, an entire electrode 14 obtained by stacking a light reflection electrode 14a and a cover electrode 14b is provided substantially over the entire upper surface of the p-type semiconductor layer 12p of the semiconductor stacked body 12. More specifically, in FIG. 3A, the region with hatching refers to a region provided with the p-type semiconductor layer 12p and the cover electrode 14b. In addition, the light reflection electrode 14a has an upper surface and a side surface coated with the cover electrode 14b, and placed in an inside region included in the region with the cover electrode 14b placed therein in planar view, as shown with the hatching in FIG. 3B.

Figure 4A:
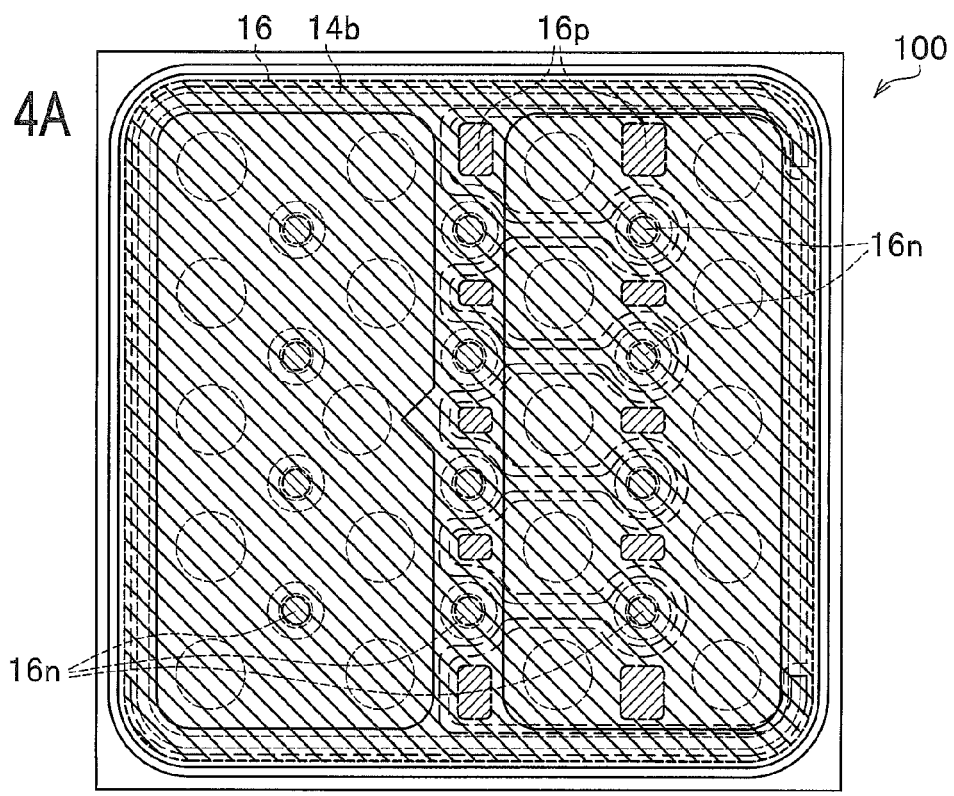
FIGS. 4A and 4B are schematic plan views illustrating the layered structure of the light-emitting device according to the first embodiment of the present invention, where

Furthermore, as shown in FIG. 1B and FIG. 4A, the interlayer insulating film 16 is provided on the upper surface and side surface of the entire electrode 14, and the upper surface and side surface of the semiconductor stacked body 12 (shaded region with hatching in FIG. 4A). The interlayer insulating film 16 has an opening 16n at the bottom of the first exposed part 12b, and an opening 16p partially on the cover electrode 14b. The opening 16n is provided in a circular shape at the bottom for each of the first exposed parts 12b provided at the twelve points, and the opening 16p is provided in a rectangular shape with corners rounded at ten points on the cover electrode 14b. In addition, the interlayer insulating film 16 also has an opening at the bottom of the second exposed part 12c.

It is to be noted that the interlayer insulating film 16 may be adapted coat the upper surface of the n-type semiconductor layer 12n end to end, without any opening on the second exposed part 12c.

Figure 4B:
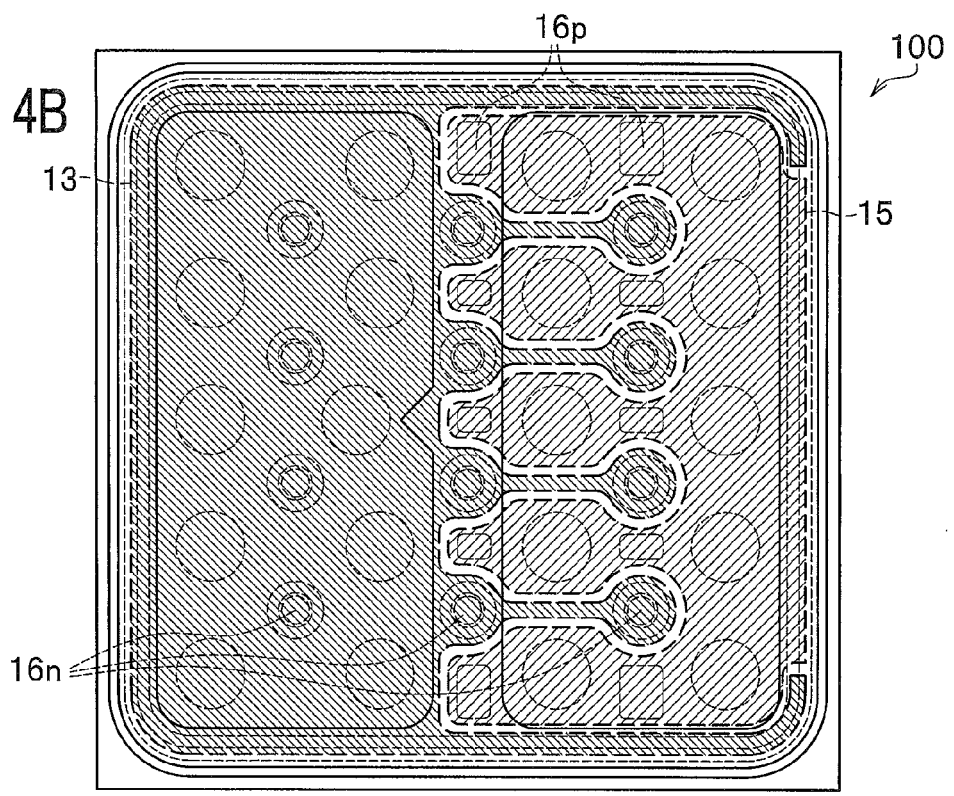

Furthermore, as shown in FIG. 1B and FIG. 4B, the p-side electrode 15 which serves as a p-side pad electrode of the light-emitting element 1 is electrically connected to the cover electrode 14b at the opening 16p, and formed to extend partially over the upper surface of the cover electrode 14b and the side surface and bottom of the second exposed part 12c in the right half region in FIG. 4B, with the interlayer insulating film 16 interposed therebetween.

Moreover, the n-side electrode 13 which serves as an n-side pad electrode of the light-emitting element 1 is electrically connected to the n-type semiconductor layer 12n at the opening 16n, and provided to extend over the bottom and side surface of the first exposed part 12b, the upper surface and side surface of the cover electrode 14b except for the region with the p-side electrode 15 provided thereon and the vicinity thereof, and the side surface and bottom of the second exposed part 12c, with the interlayer insulating film 16 interposed therebetween.

More specifically, the light-emitting element 1 has both the n-side electrode 13 and p-side electrode 15 provided on one side of the semiconductor stacked body 12.

In addition, as just described, the n-side electrode 13 or/and p-side electrode 15 extensively provided on the upper surface and side surface of the light-emitting element 1 can improve the heat release performance of the light-emitting device 100, which effectively transfers heat to the resin layer 21 of the support 2 described later.

For the semiconductor stacked body 12 (n-type semiconductor layer 12n, active layer 12a, and p-type semiconductor layer 12p), a semiconductor such as $In_XAl_YGa_{1-X-Y}N$ ($0 \leq X$, $0 \leq Y$, $X+Y<1$) is preferably used. In addition, these semiconductor layers may each have a single-layer structure, or have a stacked structure of layers that differ in composition and film thickness, etc., a superlattice structure, etc. In particular, the active layer 12a preferably has a single quantum well or multiple quantum well structure of thin films stacked, which produces a quantum effect.

The entire electrode 14 is adapted to have functions as a current diffusion layer and a light reflection layer, and composed of the light reflection electrode 14a and cover electrode 14b stacked.

The light reflection electrode 14a is provided so as to cover substantially the entire upper surface of the p-type semiconductor layer 12p. In addition, the cover electrode 14b is provided so as to coat the entire upper surface and side surface of the light reflection electrode 14a. The light reflection electrode 14a is a layer for uniformly diffusing, to the entire surface of the p-type semiconductor layer 12p, an electric current supplied through the cover electrode 14b and the p-side electrode 15 provided partially on the upper surface of the cover electrode 14b. In addition, the light reflection electrode 14a has favorable light reflectivity, and also function as a layer for reflecting light emitted by the light-emitting element 1 downward to the light extraction surface.

For the light reflection electrode 14a, metallic materials can be used which have favorable electrical conductivity and light reflectivity. In particular, as a metallic material that has favorable reflectivity in a visible light range, Ag, Al, or an alloy containing the metals as its main constituent is preferably used. In addition, single layers of the metallic materials, or laminated layers thereof can be used for the light reflection electrode 14a.

Furthermore, the cover electrode 14b is a bather layer for preventing migration of the metallic material constituting the light reflection electrode 14a. In particular, in the case of using, as the light reflection electrode 14a, Ag or an alloy containing Ag as its main constituent, which is likely to cause migration, it is preferable to provide the cover electrode 14b.

As the cover electrode 14b, metallic materials can be used which have favorable electrical conductivity and barrier performance, and for example, Al, Ti, W, Au, and AlCu alloy, and the like can be used. In addition, single layers of the metallic materials, or laminated layers thereof can be used for the cover electrode 14b.

It is to be noted that while the placement region of the cover electrode 14b in a planar view is illustrated to correspond to the placement region of the p-type semiconductor layer 12p for descriptive purposes in FIG. 1A, the cover electrode 14b is provided slightly inside the p-type semiconductor layer 12p. The same applies to the manufacturing process chart described later.

The n-side electrode 13 is electrically connected to the n-type semiconductor layer 12n at the openings 16n of the interlayer insulating film 16 at the bottoms of the first exposed parts 12b provided at the twelve points. This connection to the n-type semiconductor layer 12n at the points located extensively can evenly diffuse, to the n-type semiconductor layer 12n, an electric current supplied through the n-side electrode 13, and thus improve the luminous efficiency.

In addition, the p-side electrode 15 is electrically connected to the cover electrode 14b at the openings 16p of the interlayer insulating film 16 provided at the ten points on the upper surface of the cover electrode 14b.

Figure 5A:
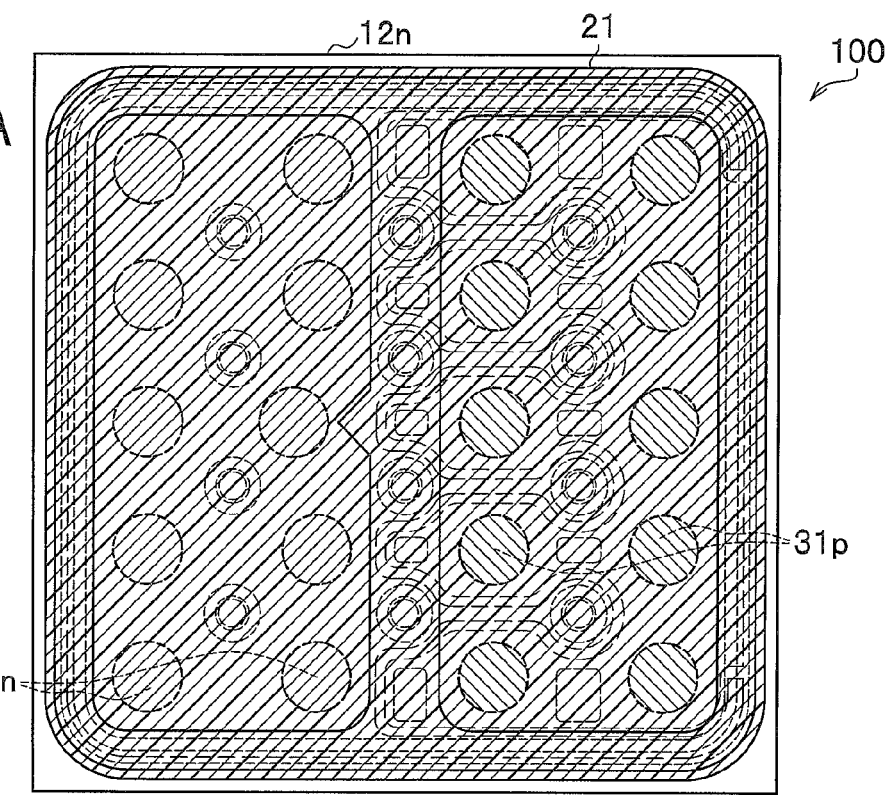
FIGS. 5A and 5B are schematic plan views illustrating the layered structure of the light-emitting device according to the first embodiment of the present invention, where

As shown in FIG. 5A, the upper surface of the n-side electrode 13 has ten first metallic layers 31n provided so as to be electrically connected to the n-side electrode 13, whereas the upper surface of the p-side electrode 15 has ten first metallic layers 31p provided so as to be electrically connected to the p-side electrode 15.

As the n-side electrode 13 and the p-side electrode 15, metallic materials can be used, and for example, single element metals such as Ag, Al, Ni, Rh, Au, Cu, Ti, Pt, Pd, Mo, Cr, and W, alloys containing the metals as their main constituents, etc. are preferably used. It is to be noted that in the case of using an alloy, a non-metallic element such as Si may be contained as a constituent element, and for example, an AlSiCu alloy (ASC) may be used. In addition, single layers of the metallic materials, or laminated layers thereof can be used for the n-side electrode 13 and the p-side electrode 15.

The interlayer insulating film (insulating film) 16 is a film that coats the upper surfaces and side surfaces of the semiconductor stacked body 12 and entire electrode 14. The interlayer insulating film 16 functions as a protective film and an antistatic film for the light-emitting element 1. In addition, the n-side electrode 13 and the p-side electrode 15 are provided to extend in a complementary style extensively on the upper surface of the interlayer insulating film 16. As the interlayer insulating film 16, metal oxides and metal nitrides can be used, and for example, an oxide or a nitride of at least one selected from the group consisting of Si, Ti, Zr, Nb, Ta, and Al is preferably used. Alternatively, as the interlayer insulating film 16, two or more light-transmissive dielectric materials that differ in refractive index may be used and laminated to constitute DBR (Distributed Bragg Reflector) film.

It is to be noted that the light-emitting element 1 shown in FIG. 1 is provided by way of example, but the invention is not to be limited to this example. The light-emitting element 1 needs only to have the n-side electrode 13 and p-side electrode 15 provided on one surface of the semiconductor stacked body 12, and the placement regions of the first exposed part 12b, n-side electrode 13, and p-side electrode 15, and the like can be defined appropriately. Furthermore, in place of, or in addition to the first exposed part 12b, the n-type semiconductor layer 12n and the n-side electrode 13 may be adapted to be electrically connected at the second exposed part 12c.

The support 2 in the shape of a square prism, which is substantially the same shape as the outline of the light-emitting element 1 in planar view, is provided to be joined to the side provided with the n-side electrode 13 and p-side electrode 15 of the light-emitting element 1, and is a reinforcing member for mechanically maintaining the structure of the light-emitting element 1 with the growth substrate 11 (see FIG. 8A) removed. The support 2 is composed of the first resin layer 21 including therein the first metallic layers 31n and 31p and the second resin layer 22 including therein the second metallic layers 32n and 32p, which are stacked. The first resin layer 21 has a lower surface (this region is referred to as a "first lower surface") in contact with the electrode 13 and 15, and an upper surface (this region is referred to as a "first upper surface") opposite to the first lower surface. In addition, the first resin layer 21 has a side surface (this region is referred to as a "first side surface") extending from the first upper surface to the first lower surface. The second resin layer 22 is provided on the first resin layer 21. The second resin layer 22 has a lower surface (this region is referred to as a "second lower surface") in contact with the first upper surface of the first resin layer 21 and an upper surface (this region is referred to as a "second upper surface") opposite to the second lower surface of the second resin layer 22. In addition, the second resin layer 22 has a side surface (this region is referred to as a "second side surface") extending from the second upper surface to the second lower surface of the second resin layer 22.

It is to be noted that the light-emitting device 100 shown in FIGS. 1A and 1B are configured so that the support 2 is included in the light-emitting element 1 in planar view, but may be configured so that the support is overlapped with the element in planar view, or configured so that the support 2 includes therein the light-emitting element 1.

The stacked body composed of the first resin layer 21 and the second resin layer 22 is a base body of a reinforcing member for the light-emitting element 1. The first resin layer 21 and the second resin layer 22 almost matches the outline of the light-emitting element 1 in planar view as shown in FIG. 1A, but formed so that the outline of the second resin layer 22 is included in the outline of the first resin layer 21. For this reason, the difference 23 is formed at the boundary between the first resin layer 21 and the second resin layer 22 in the thickness direction.

Furthermore, the side surface of the first resin layer 21 has the difference 21b formed so that a lower part of the side surface is included in an upper part thereof in planar view, which can reduce the blockage of light by the first resin layer 21, the light emitted from the semiconductor stacked body 12 (in particular, the n-type semiconductor layer 12n) to the outside.

The first resin layer 21 has, as internal wiring, ten first metallic layers 31n and ten first metallic layers 31p so as to penetrate in the thickness direction.

In addition, the second resin layer 22 has, as internal wiring, one second metallic layer 32n and one second metallic layer 31p so as to penetrate in the thickness direction. The second resin layer 22 partitions the second metallic layer 32n and second metallic layer 32p which are electrodes with two polarities for external connection, and in planar view, the upper surface in a region corresponding to an outer edge is formed at the same level as the upper surface in the partitioning region. For this reason, when the light-emitting device 100 is mounted face-down, the light-emitting device 100 can be attached to the mounting substrate in a favorable manner, and the inner wall constituting the partitioning region can prevent an adhesive member for use around the second metallic layer 32n from being brought into contact with an adhesive member for use around the second metallic layer 32p.

It is to be noted that the region which partitions the second metallic layer 32n and the second metallic layer 32p preferably has a width on the order of 200 μm or more and 500 μm or less in the case of the second resin layer 22.

While materials known in the art can be used as resin materials for the first resin layer 21 and the second resin layer 22, it is preferable to use photosensitive resin materials for use as photoresists. With the use of the photosensitive resin materials, the first resin layer 21 and the second resin layer 22 can be easily subjected to patterning by a photolithography method.

The lower limit of the combined thickness of the first resin layer 21 and second resin layer 22 can be defined so as to provide adequate strength as a reinforcing member for the light-emitting element 1 with the growth substrate peeled off or reduced in thickness.

For example, from the point of view as a reinforcing member, the combined thickness of the first resin layer 21 and second resin layer 22 is preferably adjusted to on the order of 30 μm or more, and further preferably to on the order of 90 μm or more.

Furthermore, in view of the volume percent of the metal in the first resin layer 21 and the second resin layer 22, and the amount of heat generated by the light-emitting element 1, the upper limit of the combined thickness of the first resin layer 21 and second resin layer 22 can be defined so as to provide adequate heat release performance, and is preferably, for example, on the order of 150 μm or less, and further preferably adjusted to on the order of 120 μm or less.

The first metallic layer (n-side first metallic layer) 31n is provided within the first resin layer 21 so as to penetrate in the thickness direction, and intended to serve as n-side internal wiring for electrically connecting the n-side electrode 13 as an electrode of the light-emitting element 1 and the second metallic layer 32n as an electrode for external connection.

In the first embodiment, on the n-side electrode 13 (see FIG. 4B) in the left-half region of the light-emitting device 100, the ten first metallic layers 31n arranged in two lines of five pieces for each line (the region with positively sloped hatching in FIG. 5A) are provided as shown in FIG. 5A.

The first metallic layer (p-side first metallic layer) 31p is provided within the first resin layer 21 so as to penetrate in the thickness direction, and intended to serve as p-side internal wiring for electrically connecting the p-side electrode 15 as an electrode of the light-emitting element 1 and the second metallic layer 32p as an electrode for external connection.

In the first embodiment, on the p-side electrode 15 (see FIG. 4B) in the right-half region of the light-emitting device 100, the ten first metallic layers 31p arranged in two lines of five pieces for each line (the region with negatively sloped hatching in FIG. 5A) are provided as shown in FIG. 5A.

The second metallic layer (n-side second metallic layer) 32n has a lower surface (this region is referred to as a "metallic lower surface") and a upper surface (this region is referred to as a "metallic upper surface") opposite to the metallic lower surface. The second metallic layer 32n is provided within the second resin layer 22 so as to penetrate in the thickness direction, and intended to serve as n-side internal wiring that has an upper surface as a mounting surface for external connection.

Figure 5B:
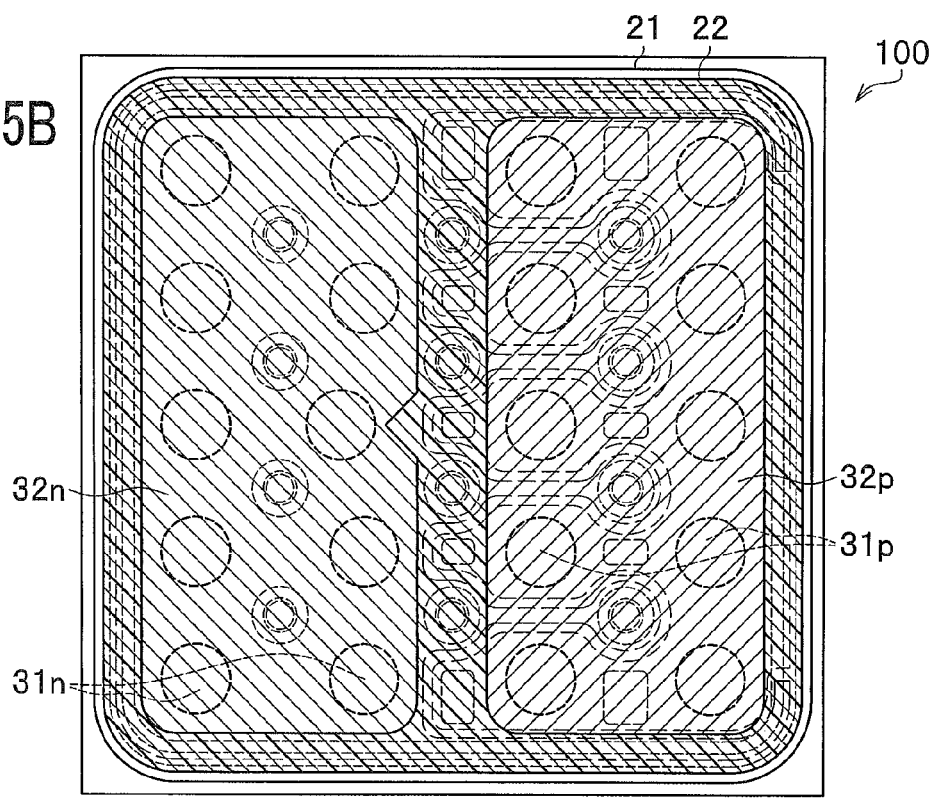

As shown in FIGS. 5A and 5B, in the first embodiment, the second metallic layer 32n is provided in the left-half region of the light-emitting device 100, and the upper surfaces of the ten first metallic layers 31n are electrically connected to the lower surface of the second metallic layer 32n.

The second metallic layer (p-side second metallic layer) 32p has a lower surface (this region is referred to as a "metallic lower surface") and a upper surface (this region is referred to as a "metallic upper surface") opposite to the metallic lower surface. The second metallic layer 32p is provided within the second resin layer 22 so as to penetrate in the thickness direction, and intended to serve as p-side internal wiring that has an upper surface as a mounting surface for external connection.

As shown in FIGS. 5A and 5B, in the first embodiment, the second metallic layer 32p is provided in the right-half region of the light-emitting device 100, and the upper surfaces of the ten first metallic layers 31p are electrically connected to the lower surface of the second metallic layer 32p.

Figure 2:
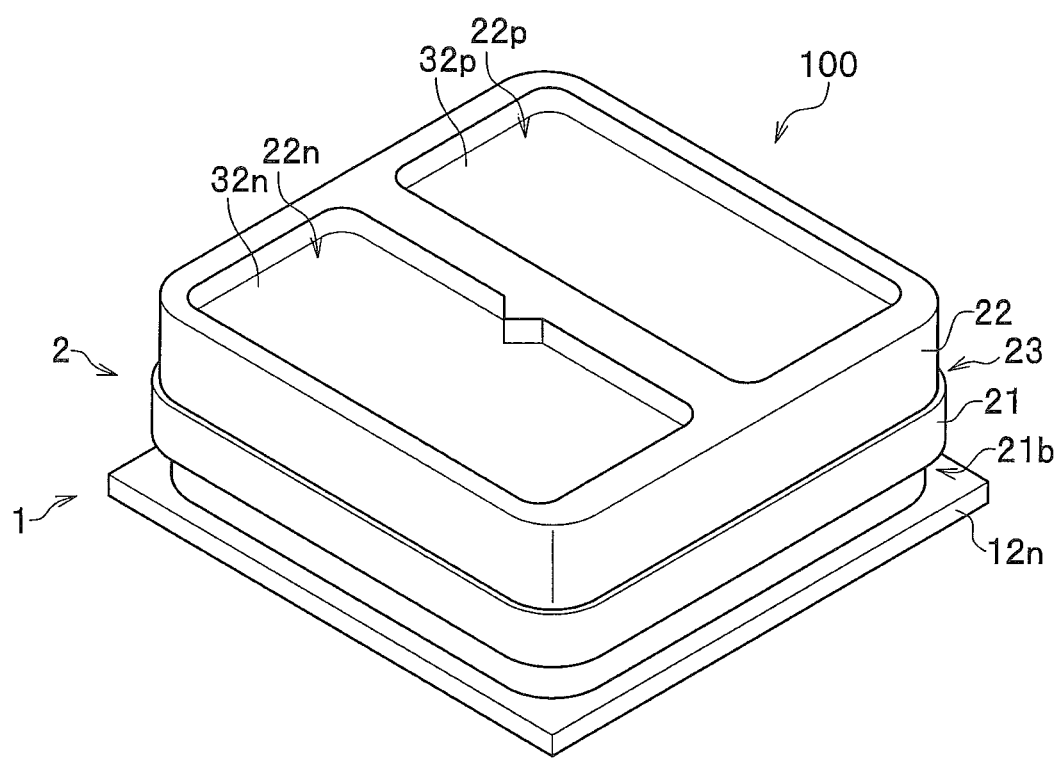
FIG. 2 is a schematic perspective view illustrating the structure of the light-emitting device according to the first embodiment of the present invention.

In addition, the light-emitting device 100 shown in FIGS. 1A and 1B and FIG. 2 is formed so that the upper surfaces of the second metallic layers 32n and 32p serve as flattened surfaces that are horizontal (perpendicular to the stacking direction of the semiconductor stacked body 12), and the upper surfaces are provided entirely at a lower level than the upper surface of the second resin layer 22.

Furthermore, the difference in level between the upper surfaces of the second metallic layers 32n and 32p and the upper surface of the second resin layer 22 is preferably adjusted to on the order of 5 μm or more and 10 μm or less. The adjustment of the difference in level to on the order of 5 μm or more can house the adhesive member to suppress leakage of an excessive adhesive member. In addition, the upper limit of the difference in level is not particularly limited, but preferably adjusted to on the order of 10 μm or less so that the amount of the adhesive member used is not excessively increased.

In this regard, in the case of forming the second resin layer 22 by a photolithography method, the thickness of the second resin layer 22 which can be produced has an upper limit on the order of 80 μm. In addition, the growth rate of plating grown by an electrolytic plating method has no substantial difference between in the vertical direction (up-down direction in FIG. 1B) and the horizontal direction (lateral direction in FIG. 1B). A case will be considered in which the first metallic layers 31n and 31p which serve as seed layers in the formation of the second metallic layers 32n and 32p by an electrolytic plating method are discretely arranged as shown in FIGS. 5A and 5B. It is preferable to grow the second metallic layers 32n and 32*p* over the entire region in the horizontal direction at the bottoms of the openings 22*n* and 22*p* of the second resin layer 22, before the second metallic layers 32*n* and 32*p* reach the level of the upper surface of the second resin layer 22 in the vertical direction. To this end, the interval in the horizontal direction between the discretely arranged first metallic layers 31*n* and 31*p* needs to be shorter than twice the thickness of the second resin layer 22. Accordingly, the upper limit of the difference in level between the upper surfaces of the second metallic layers 32*n* and 32*p* and the upper surface of the second resin layer 22 can be defined depending on the interval between the first metallic layers 31*n* and 31*p* and the thickness of the second resin layer 22.

It is to be noted that the upper surfaces of the second metallic layers 32*n* and 32*p* are not to be considered limited in shape to the above. The upper surfaces of the second metallic layers 32*n* and 32*p* may be flattened and inclined, or be uneven. In addition, it is only necessary for the upper surfaces of the second metallic layers 32*n* and 32*p* to be formed so as to be at least partially lower than the upper surface of the second resin layer 22, and when the upper surfaces are uneven, the upper end of convex portions may be made higher than the upper surface of the second resin layer 22.

Moreover, the first metallic layers 31*n* and 31*p* and the second metallic layers 32*n* and 32*p* also function as heat transfer pathways for releasing heat generated by the light-emitting element 1. Therefore, the volume ratio of the metal to the first resin layer 21 and the second resin layer 22 is preferably higher.

As the first metallic layers 31*n* and 31*p* and the second metallic layers 32*n* and 32*p*, metals such as Cu, Au, and Ni are preferably used. In addition, the first metallic layers 31*n* and 31*p* and the second metallic layers 32*n* and 32*p* may be adapted to have a laminate structure with different kinds of metals. In particular, for the second metallic layers 32*n* and 32*p* of which the upper surfaces serve as mounting surfaces, it is preferable to form at least the uppermost layers from Au in order to prevent corrosion, and enhance the joining to a mounting substrate with an An-alloy adhesive member such as Au—Sn eutectic solder. In addition, when lower layer parts of the second metallic layers 32*n* and 32*p* are formed from a metal other than Au, such as Cu, upper layer parts thereof may be adapted to have a laminate structure such as Ni/Au and Ni/Pd/Au in order to increase the adhesion to Au.

In addition, solder of, for example, Sn—Cu and Sn—Ag—Cu can be also used as the adhesive member. In such cases, the uppermost layers of the second metallic layers 32*n* and 32*p* are preferably composed of a material that achieves favorable adhesion to the adhesive member used.

The first metallic layers 31*n* and 31*p* and the second metallic layers 32*n* and 32*p* can be formed by an electrolytic plating method. Details will be given later about the method for forming the first metallic layers 31*n* and 31*p* and the second metallic layers 32*n* and 32*p*.

Mounting of Light-Emitting Device

Next, the prevention of solder extrusions in mounting the light-emitting device 100 onto a mounting substrate will be described with reference to FIG. 6.

Figure 6:
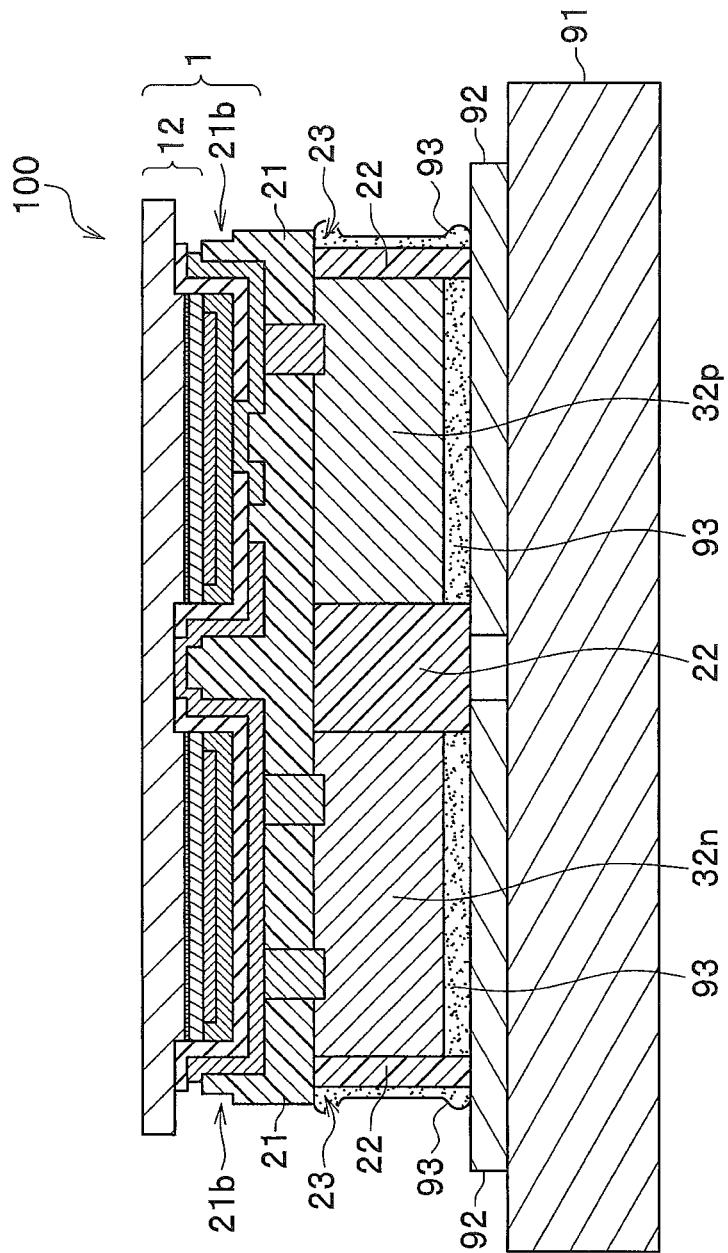
FIG. 6 is a schematic cross-sectional view of the light-emitting device according to the first embodiment of the present invention, which is mounted on a mounting substrate.

As shown in FIG. 6, the light-emitting device 100 is mounted face-down in such a way that the mounting surface of a mounting substrate 91 provided with a wiring pattern 92 is opposed to the side provided with the support 2, that is, the exposed surfaces of the second metallic layers 32*n* and 32*p* from the second resin layer 22. Accordingly, the light-emitting device 100 in FIG. 6 is turned upside down from FIG. 1B.

In addition, the light-emitting device 100 is configured to be suitable for mounting by a reflow method with the use of an adhesive member 93 such as Au—Sn eutectic solder.

For the mounting, the second metallic layers 32*n* and 32*p* and the wiring pattern 92 are firmly joined by melting the adhesive member 93 that is provided in advance between the second metallic layer 32*n* and the wiring pattern 92 and between the second metallic layer 32*p* and the wiring pattern 92, and then cooling the adhesive member 93.

In this regard, when the adhesive member 93 is melted to turn into a liquid state, the space between the surface of the second metallic layer 32*n* and the wiring pattern 92 with the corresponding polarity and the space between the second metallic layer 32*p* and the wiring pattern 92 with the corresponding polarity are filled with the adhesive member 93.

In addition, the upper surfaces (the lower surfaces in FIG. 6) of the second metallic layers 32*n* and 32*p* are at least partially made lower (higher in FIG. 6) than the upper surface (the lower surface in FIG. 6) of the second resin layer 22 to produce gaps in the openings 22*n* and 22*p* of the second resin layer 22, and the adhesive member 93 is housed in the gaps. Moreover, the second resin layer 22 serves as a wall to prevent leakage of the excessive adhesive member 93*a* to the outside.

Thus, the excessive adhesive member 93*a* is prevented from producing extrusions along the side surface of the support, that is, the side surfaces of the second resin layer 22 and the first resin layer 21.

It is to be noted that the amount of a paste (solder paste) containing the adhesive member 93, which is supplied onto the wiring pattern 92 in mounting the light-emitting device 100 onto the mounting substrate 91 by a reflow method, is preferably specified in consideration of the volume of the gaps in the openings 22*n* and 22*p* of the second resin layer 22. The second metallic layers 32*n* and 32*p* and the wiring pattern 92 can be joined in a more favorable manner by supplying the paste so that the volume of the metallic adhesive member 93 in the supplied paste is larger than the volume of the gaps in the openings 22*n* and 22*p* of the second resin layer 22.

In addition, as shown in FIG. 6, for example, even when the excessive adhesive member 93*a* is protruded from between the second metallic layers 32*n* and 32*p* and the wiring pattern 92, and further extruded along the side surface of the second resin layer 22, the difference 23 holds up the excessive adhesive member 93*a*, and further prevents the member from producing extrusions along the side surface of the first resin layer 21, because the difference 23 is provided at the boundary between the second resin layer 22 and the first resin layer 21.

When the distance of the difference 23 between the first resin layer 21 and the second resin layer 22 is denoted by d as shown in FIGS. 1A and 1B, the distance d is preferably adjusted to on the order of 1 μm or more and 10 μm or less, and further preferably to on the order of 1 μm or more and 5 μm or less. This distance can prevent the solder more effectively from being extruded.

Furthermore, in the example shown in FIG. 6, the side surface of the first resin layer 21 is also provided with the difference 21*b*. Therefore, the excessive adhesive member 93*a* is thus trapped by the difference 21*b*, and kept from producing further extrusions, even when the excessive adhesive member 93*a* crosses over the difference 23 at the boundary between the second resin layer 22 and the first resin layer 21 to produce extrusions along the side surface of the first resin layer 21. It is to be noted that the distance of the difference 21*b* formed at the side surface of the first resin layer 21 is preferably comparable to the distance d of the difference 23 between the first resin layer 21 and the second resin layer 22.

As just described, the upper surfaces (the lower surfaces in FIG. 6) of the second metallic layers 32n and 32p are at least partially made lower (higher in FIG. 6) than the upper surface (the lower surface in FIG. 6) of the second resin layer 22 to produce gaps in the openings 22n and 22p of the second resin layer 22, and the adhesive member 93 is housed in the gaps, and prevented from being leaked to the outside.

Moreover, the side surface of the resin layer composed of the first resin layer 21 and the second resin layer 22 can be provided with the difference 23, and preferably further provided with the difference 21b to block extrusions of the excessive adhesive member 93a, and prevent the solder, with more certainty, from reaching the side surface with the semiconductor stacked body 12 exposed.

Operation of Light-Emitting Device

Next, the operation of the light-emitting device 100 will be described with reference to FIGS. 1A and 1B and FIG. 6.

In the light-emitting device 100, when an external power supply is connected through the mounting substrate 91 to the second metallic layers 32n and 32p which serve as positive and negative electrodes for external connection, an electric current is supplied between the n-side electrode 13 and p-side electrode 15 of the light-emitting element 1 through the first metallic layers 31n and 31p. Then, when an electric current is supplied between the n-side electrode 13 and the p-side electrode 15, the active layer 12a of the light-emitting element 1 emits light.

The light emitted by the active layer 12a of the light-emitting element 1 propagates through the semiconductor stacked body 12, and exits from the lower surface (upper surface in FIG. 6) or side surface of the light-emitting element 1 for extraction to the outside.

It is to be noted that the light propagating upward (downward in FIG. 6) within the light-emitting element 1 is reflected by the light reflection electrode 14a to exit from the lower surface (upper surface in FIG. 6) of the light-emitting element 1 for extraction to the outside.

Method for Manufacturing Light-Emitting Device

Next, a method for manufacturing the light-emitting device 100 shown in FIGS. 1A and 1B will be described with reference to FIG. 7.

Figure 7:
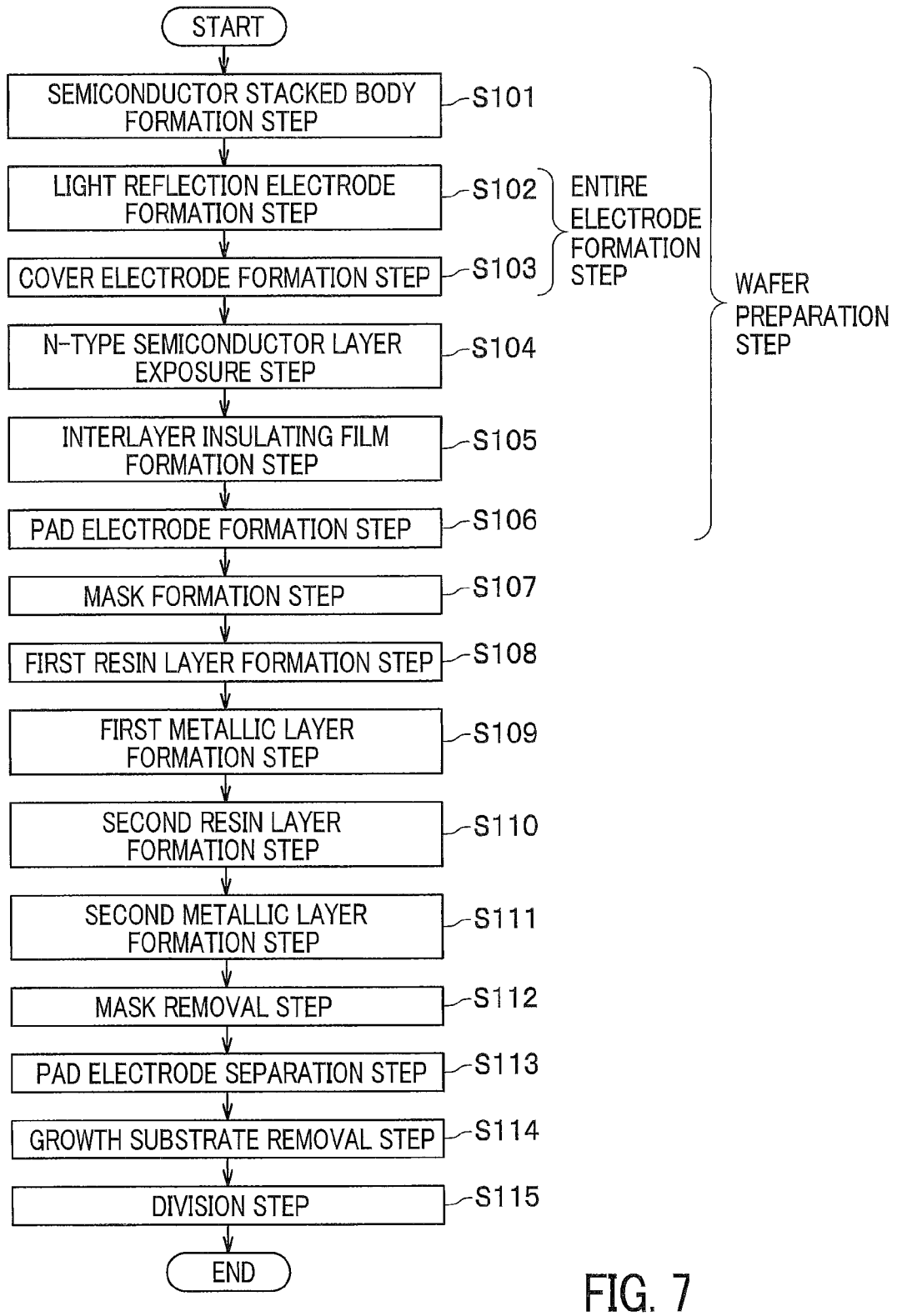
FIG. 7 is a flowchart showing the flow of a method for manufacturing the light-emitting device according to the first embodiment of the present invention.

As shown in FIG. 7, the method for manufacturing the light-emitting device 100 includes a semiconductor stacked body formation step S101, a light reflection electrode formation step S102, a cover electrode formation step S103, an n-type semiconductor layer exposure step S104, an interlayer insulating film formation step S105, a pad electrode formation step S106, a mask formation step S107, a first resin layer formation step S108, a first metallic layer formation step S109, a second resin layer formation step S110, a second metallic layer formation step S111, a mask removal step S112, a pad electrode separation step S113, a growth substrate removal step S114, and a division step S115, and the respective steps are carried out in this order.

In addition, the semiconductor stacked body formation step S101 through the pad electrode formation step S106 are included as a wafer preparation step for preparing the light-emitting element 1 in a wafer state, and the light reflection electrode formation step S102 and the cover electrode formation step S103 are included as an entire electrode formation step.

The respective steps will be described below in detail with reference to FIG. 8A through FIG. 14 (see FIG. 1A through FIG. 5B and FIG. 7 appropriately). It is to be noted that the shape, size, and positional relationship may be appropriately simplified or exaggerated for each member in FIG. 8A through FIG. 14.

In addition, each step is carried out with a number of light-emitting elements two-dimensionally arranged in the process for manufacturing the light-emitting device 100 on a wafer level. In FIG. 8A through FIG. 14, as for the arrangement of the light-emitting elements, the cross-sectional views illustrate two light-emitting elements, whereas the plan views illustrate 2×2=4 light-emitting elements.

In addition, the cross-sectional views shown in FIG. 8A through FIG. 14 correspond to the line I-I in FIG. 1A as in the case of the cross-sectional view shown in FIG. 1B, and illustrate a cross section for two light-emitting elements.

In the method for manufacturing the light-emitting device according to the first embodiment of the present invention, the wafer preparation step for preparing the light-emitting element 1 is carried out with a number of light-emitting elements 1 arranged on a sheet of growth substrate 11. The wafer preparation step includes, as mentioned previously, the semiconductor stacked body formation step S101, the light reflection electrode formation step S102, the cover electrode formation step S103, the n-type semiconductor layer exposure step S104, the interlayer insulating film formation step S105, and the pad electrode formation step S106.

Figure 8A:
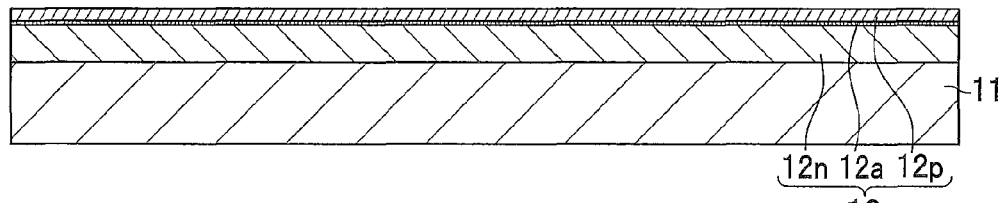
FIGS. 8A through 8E are schematic cross-sectional views partially illustrating a process of manufacturing the light-emitting device according to the first embodiment of the present invention, where

First, in the semiconductor stacked body formation step S101, as shown in FIG. 8A, with the use of the previously mentioned semiconductor material, the n-type semiconductor layer 12n, the active layer 12a, and the p-type semiconductor layer 12p are sequentially laminated to form the semiconductor stacked body 12 on the upper surface of the growth substrate 11 composed of sapphire or the like.

Figure 8B:
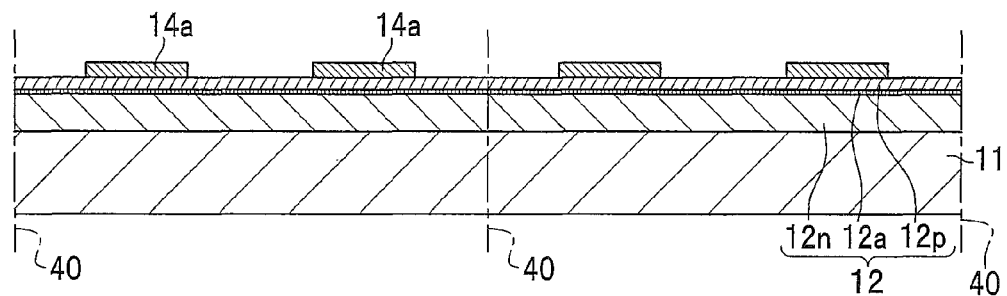

Next, in the light reflection electrode formation step S102, the light reflection electrode 14a is formed in a predetermined region as shown in FIG. 8B. The light reflection electrode 14a can be formed by a liftoff method. More specifically, in accordance with a photolithography method, a resist pattern is formed which has openings in the region for the arrangement of the light reflection electrode 14a, and the metallic film with favorable reflectivity, such as Ag, is then formed over the entire wafer by a sputtering method, a vapor deposition method, or the like. Then, the resist pattern is removed to provide the metallic film subjected to patterning, and the light reflection electrode 14a is thus formed.

Figure 8C:
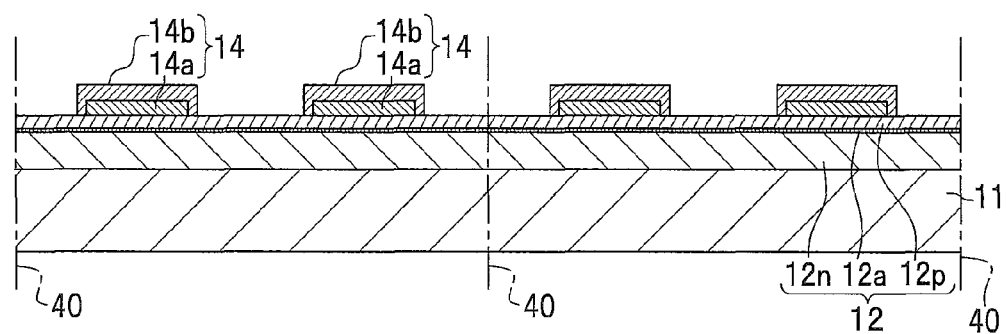

Next, in the cover electrode formation step S103, as shown in FIG. 8C, the cover electrode 14b is formed so as to coat the upper surface and side surface of the light reflection electrode 14a. For the cover electrode 14b, a predetermined metallic material is used to form a metallic film over the entire surface of the wafer by a sputtering method, a vapor deposition method, or the like, and a resist pattern is then formed by a photolithography method which has openings in the region for the arrangement of the cover electrode 14b. Then, the metallic film is subjected to patterning by etching with the resist pattern as a mask, and thereafter, the resist pattern is removed to form the cover electrode 14b.

Figure 8D:
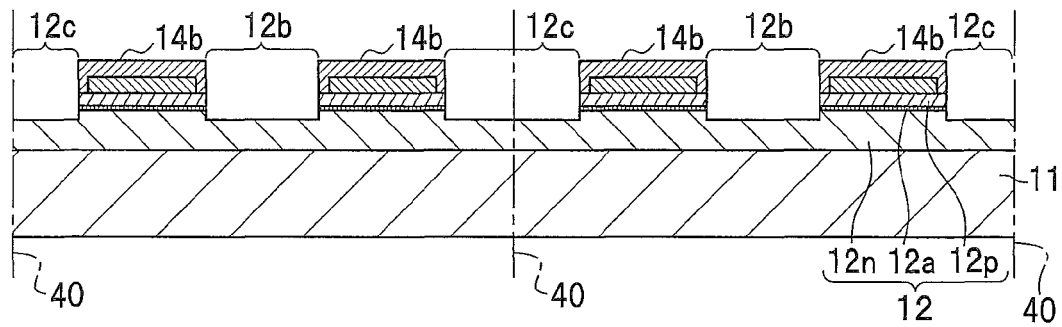

Next, in the n-type semiconductor layer exposure step S104, as shown in FIG. 8D, as for a region of the semiconductor stacked body 12, the p-type semiconductor layer 12p, the active layer 12a, and the n-type semiconductor layer 12n are partially removed by dry etching to form the first exposed part 12b and second exposed part 12c with the n-type semiconductor layer 12n exposed at the bottoms thereof.

It is to be noted that an etching mask (not shown) for the dry etching is formed by a photolithography method so as to coat the cover electrode 14b. For this reason, although FIG. 8D shows, for descriptive purposes, ends of the cover electrode 14b and ends of the p-type semiconductor layer 12p (that is, ends of the first exposed part 12b and second exposed part 12c) to coincide with each other, the p-type semiconductor layer 12p is left over a wider area than the placement region of the cover electrode 14b, by the thickness of the etching mask provided on the side surface of the cover electrode 14b.

Figure 8E:
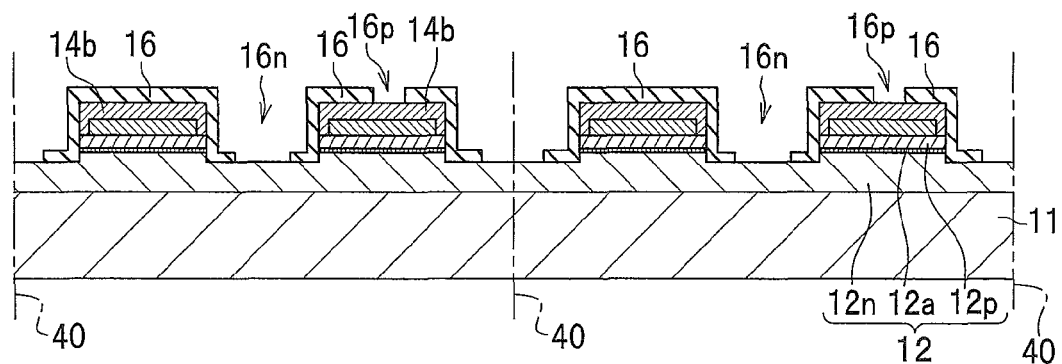

Next, in the interlayer insulating film formation step (insulating film formation step) S105, as shown in FIG. 8E, partially on the upper surfaces of the first exposed part 12b and cover electrode 14b, a predetermined insulating material is used to form the interlayer insulating film 16 with the opening 16n and the opening 16p, respectively. In addition, the interlayer insulating film 16 is formed to open partially at the bottom of the second exposed part 12c as a region along the boundary line 40. It is to be noted that the bottom of the second exposed part 12c may be entirely coated with the interlayer insulating film 16 without having any opening.

In addition, the interlayer insulating film 16 can be obtained by patterning, in such a way that an insulating film is formed by a sputtering method or the like over the entire surface of the wafer, a resist pattern is then formed which has openings in the predetermined regions, and the insulating film is etched.

Figure 9A:
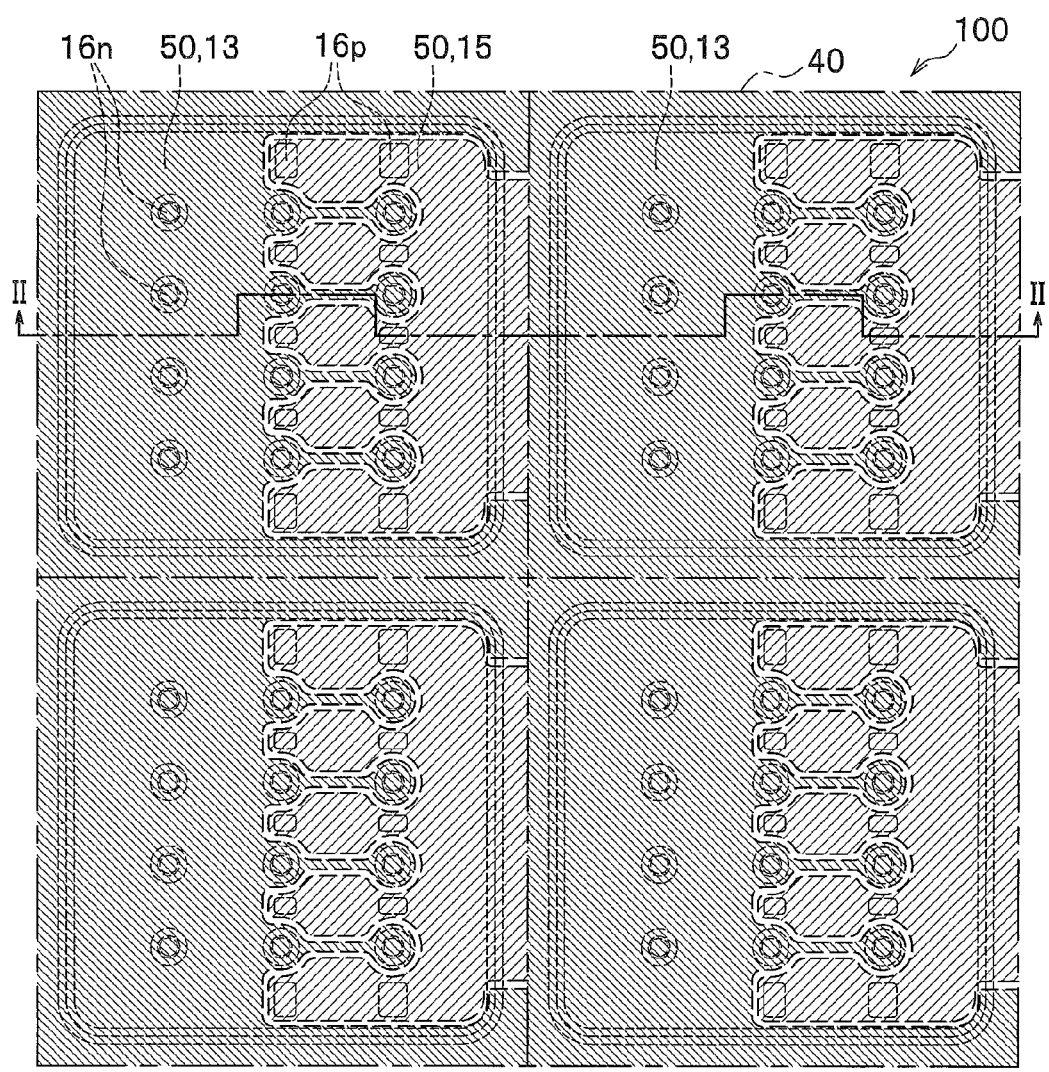
FIGS. 9A and 9B are schematic views illustrating a pad electrode formation step in a process of manufacturing the light-emitting device according to the first embodiment of the present invention, where
Figure 9B:
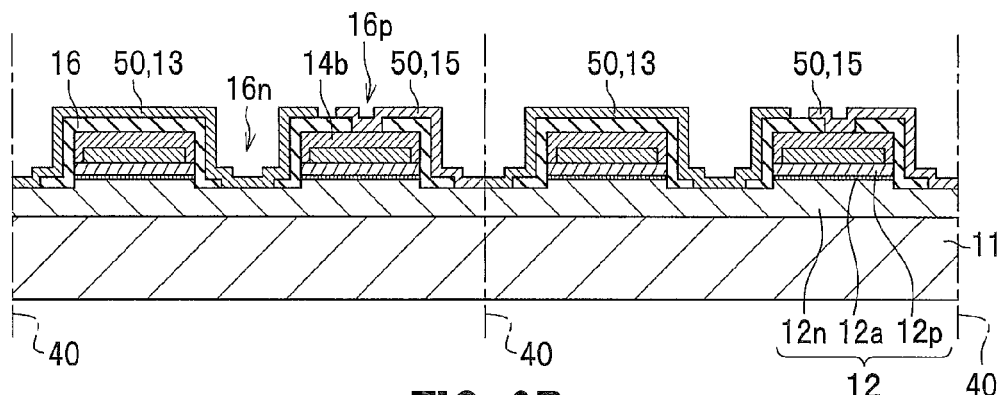

Next, in the pad electrode formation step (electrode formation step) S106, as shown in FIGS. 9A and 9B, a metallic layer 50 is formed on the interlayer insulating film 16 by, for example, a sputtering method. It is to be noted that the metallic layer 50 can be subjected to patterning, for example, a liftoff method.

The metallic layer 50 is intended to serve as the n-side electrode 13 and the p-side electrode 15 which are pad electrodes as the light-emitting element 1. Therefore, the metallic layer 50 is connected to the n-type semiconductor layer 12n at the opening 16n of the interlayer insulating film 16, which is provided in the region (the region with negatively sloped hatching in FIG. 9A) which serves as the n-side electrode 13. In addition, the metallic layer 50 is connected to the cover electrode 14b at the opening 16p of the interlayer insulating film 16, which is provided in the region (the region with positively sloped hatching in FIG. 9A) which serves as the p-side electrode 15.

The metallic layer 50 is formed separately in the region of each light-emitting element 1 partitioned by the boundary line 40 so that the region which serves as the n-side electrode 13 and the region which serves as the p-side electrode 15 are not brought into contact with each other, but formed so that the metallic layer 50 provides continuity for all of the light-emitting elements 1 connected in the region along the boundary line 40 and formed in the arrangement on the wafer.

The metallic layer 50 is used as a seed layer for the formation of the first metallic layers 31n and 31p by an electrolytic plating method in the first metallic layer formation step S109 as a subsequent step, and also used as a seed layer, that is, a current pathway for the formation of the second metallic layers 32n and 32p by an electrolytic plating method in the second metallic layer formation step S111. In the first embodiment, the manufacturing process can be simplified, because the metallic layer 50 which serves as the n-side electrode 13 and the p-side electrode 15 as pad electrodes also serves as seed layers for electrolytic plating.

Figure 10A:
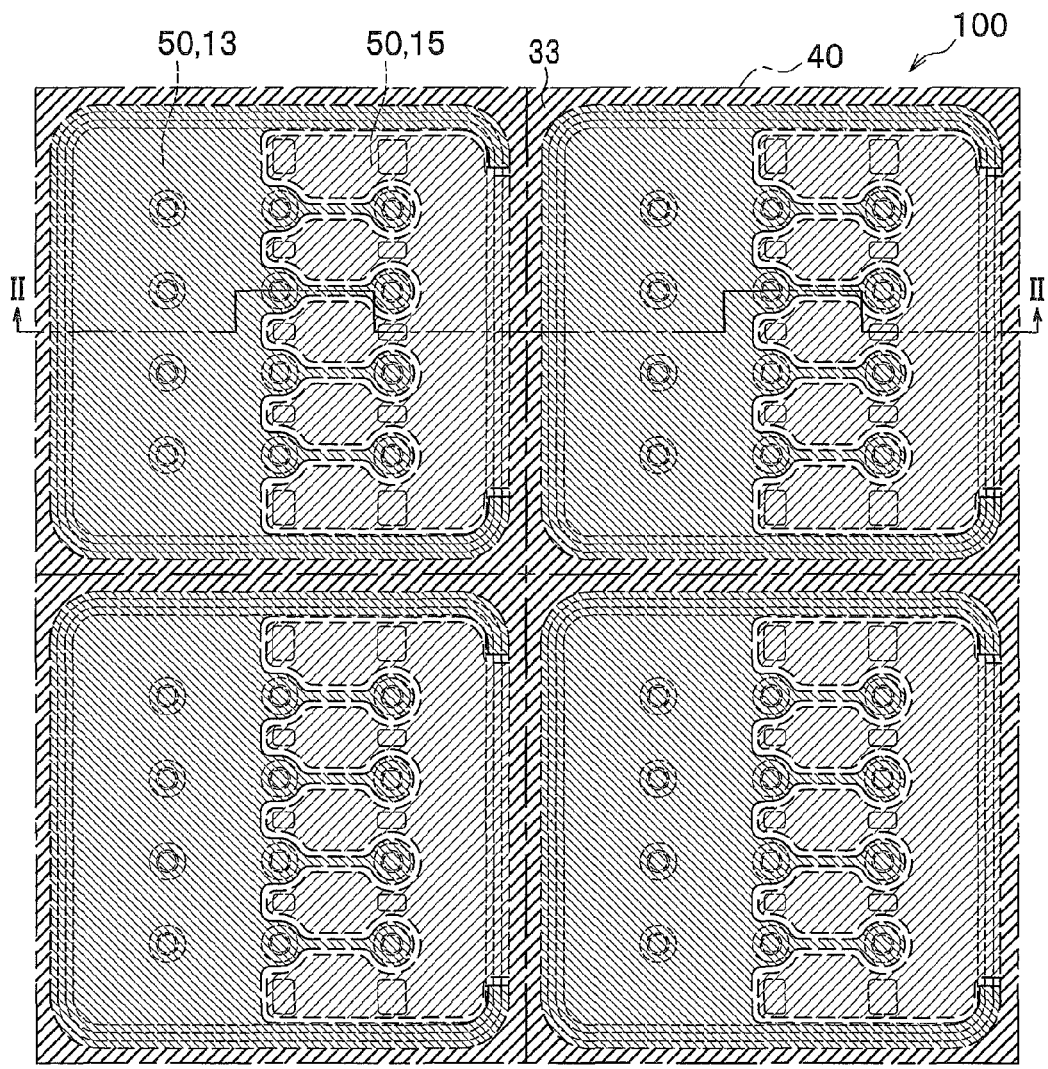
FIGS. 10A and 10B are schematic views illustrating a mask formation step in a process of manufacturing the light-emitting device according to the first embodiment of the present invention, where
Figure 10B:
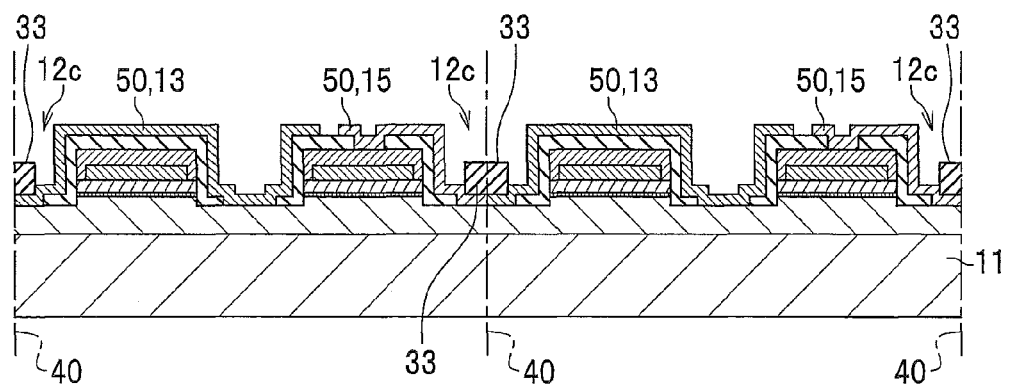

Next, in the mask formation step S107, as shown in FIGS. 10A and 10B, a mask 33 is formed which coats the metallic layer 50 formed on the second exposed part 12c as the region along the boundary line 40. The mask 33 is formed with the use of an insulating material such as photoresist or SiO$_2$. The mask 33 is an insulating mask for keeping plating from being grown on the second exposed part 12c as a boundary region in the first metallic layer formation step S109 and second metallic layer formation step S111 as subsequent steps.

It is to be noted that the mask 33 is formed from a material that is different from that of the first resin layer 21 and the second resin layer 22, so as to be able to be selectively removed with the first resin layer 21 and second resin layer 22 left in the mask removal step S112.

In addition, the mask 33 is preferably formed at a level lower than the upper surface of the first resin layer 21 (see FIG. 11A) formed in the next first resin layer formation step S108, to be wider than the opening 21a (see FIG. 11A) of the first resin layer 21. With this formation, the difference 21b (see FIG. 12B) can be formed at the side surface of the first resin layer 21.

Figure 11A:
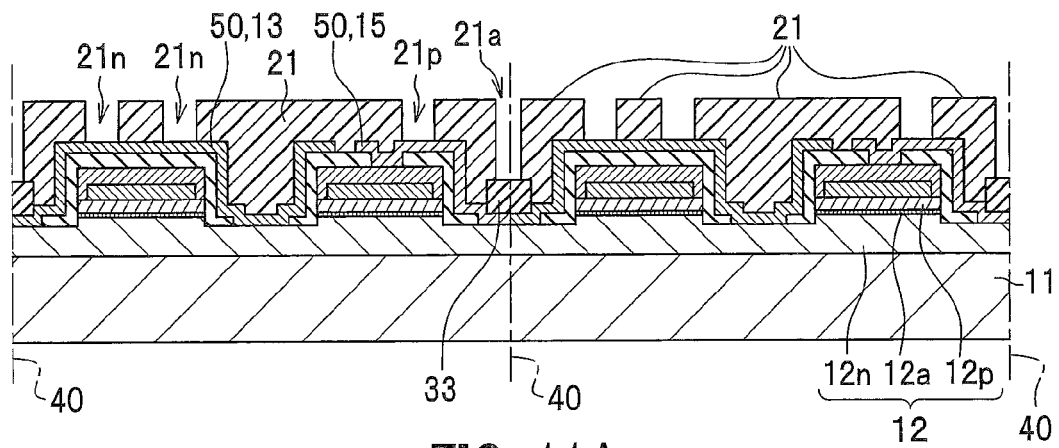
FIGS. 11A through 11C are schematic cross-sectional views partially illustrating a process of manufacturing the light-emitting device according to the first embodiment of the present invention, where

Next, in the first resin layer formation step S108, as shown in FIG. 11A, the first resin layer 21 is formed on the metallic layer 50 by a photolithography method. The first resin layer 21 is formed to have the opening 21n on the region of the metallic layer 50, which serves as the n-side electrode 13, and have the opening 21p on the region of the metallic layer 50, which serves as the p-side electrode 15. Furthermore, the first resin layer 21 has the opening 21a on the region along the boundary line 40, to be formed separately for each region of light-emitting element 1. In addition, the opening 21a is preferably formed to be smaller than the width of the mask 33.

Figure 11B:
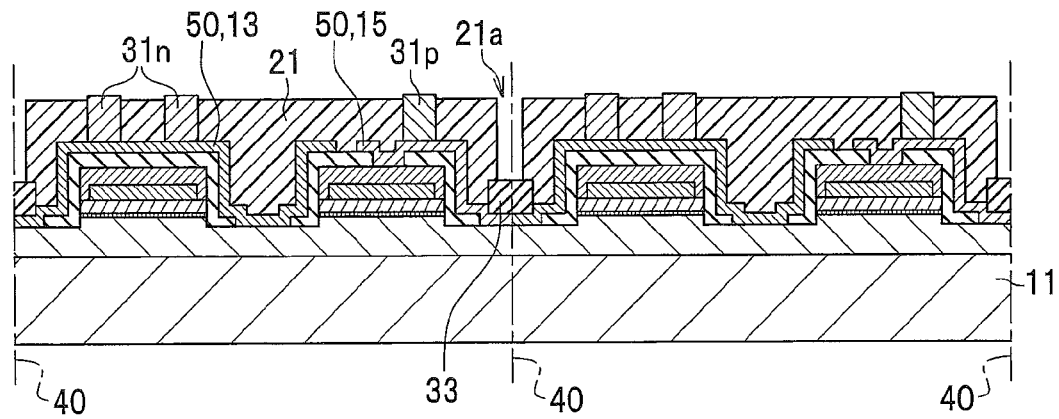

Next, in the first metallic layer formation step S109, as shown in FIG. 11B, the first metallic layers 31n and 31p are formed by an electrolytic plating method in the openings 21n and 21p of the first resin layer 21. The first metallic layers 31n and 31p are formed through growth by plating in the openings (this region is referred to as "the first openings") 21n and 21p of the first resin layer 21 with the use of the metallic layer 50 formed for entire continuity as a seed layer that serves as a current pathway for electrolytic plating as described previously.

In addition, in the first metallic layer formation step S109, at the second exposed part 12c (see FIG. 10B), which is the region along the boundary line 40, the first resin layer 21 has the opening, but there is no growth by plating, because the metallic layer 50 is coated with the mask 33. Thus, because no plating layer of thick film is formed in the boundary region, the unnecessary metallic layer 50 can be easily removed in the pad electrode separation step S113 which is a subsequent step.

It is to be noted that while the first metallic layers 31n and 31p are formed to project from the first resin layer 21 in the example shown in FIG. 11B, but not limited to this example, and may be formed to make the upper surfaces of the first metallic layers 31n and 31p at the same level as or lower than the upper surface of the first resin layer 21.

Figure 11C:
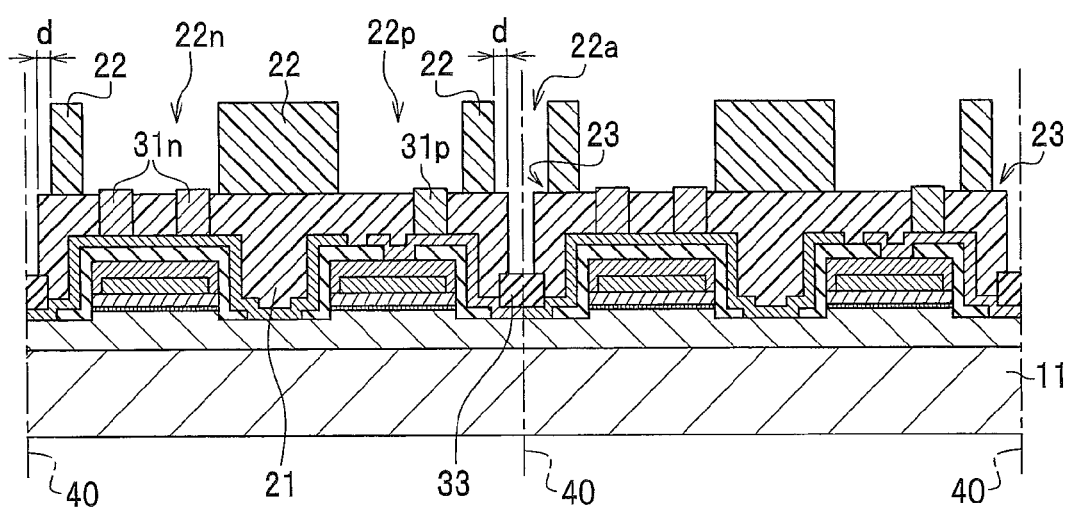

Next, in the second resin layer formation step S110, as shown in FIG. 11C, the second resin layer 22 is formed on the first resin layer 21 by a photolithography method. The second resin layer 22 is formed to have, in planar view, the opening 22n including the region with the first metallic layer 31n formed, and the opening 22p including the region with the first metallic layer 31p formed. Furthermore, the second resin layer 22 has the opening 22a on the region along the boundary line 40, to be formed separately for each region of light-emitting element 1.

In addition, the difference 23 with the distance d is formed so that the side surface of the second resin layer 22 is located inside the side surface of the first resin layer 21 in planar view in the region along the boundary line 40, that is, at an outer edge of the completed light-emitting device 100.

Figure 12A:
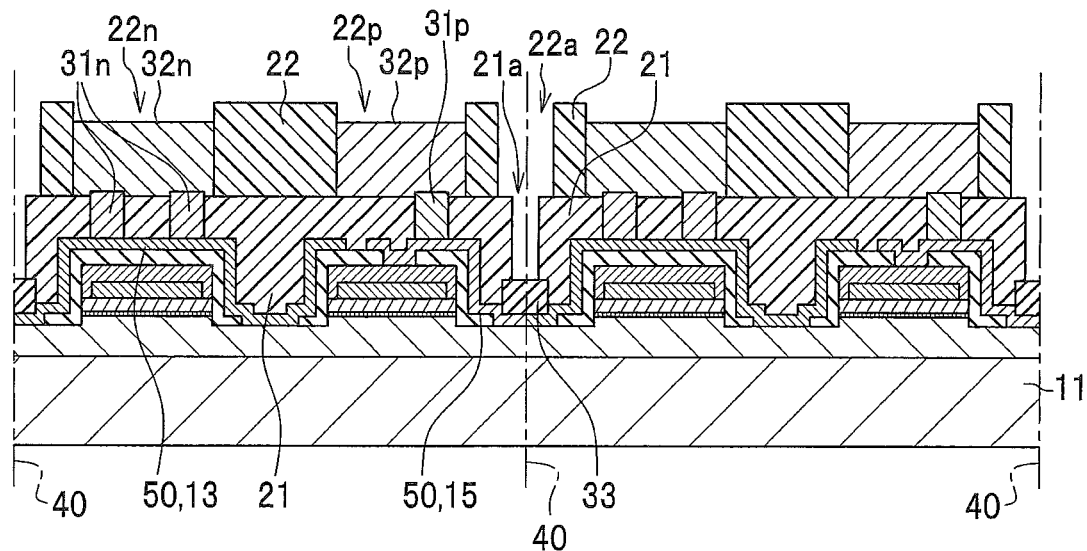
FIGS. 12A and 12B are schematic cross-sectional views partially illustrating a process of manufacturing the light-emitting device according to the first embodiment of the present invention, where

Next, in the second metallic layer formation step S111, as shown in FIG. 12A, the second metallic layers 32n and 32p are formed by an electrolytic plating method in the openings 22n and 22p of the second resin layer 22. The second metallic layers 32n and 32p are formed through growth by plating in the openings (this region is referred to as "the second openings") 22n and 22p of the second resin layer 22 with the use of the metallic layer 50 and first metallic layers 31n and 31p formed for entire continuity as seed layers, that is, current pathways for electrolytic plating as described previously. In this regard, the electrolytic plating is completed with the upper surfaces of the second metallic layers 32n and 32p at least partially lower than the upper surface of the second resin layer 22.

It is to be noted that the plating layer is grown isotropically from portions of the first metallic layers 31n and 31p exposed from the first resin layer 21, in the formation of the second metallic layers 32n and 32p by an electrolytic plating method. For this reason, when the exposed surfaces of the first metallic layers 31n and 31p are not uniformly arranged over the entire bottoms of the openings 22n and 22p of the second resin layer 22, the upper surfaces grown by plating may be uneven. Therefore, the upper surfaces of the second metallic layers 32n and 32p may be formed in a flatter fashion, in such a way that a metallic film is formed by a sputtering method or the like over the entire bottoms of the openings 22n and 22p of the second resin layer 22, and electrolytic plating is carried out with the metallic film as a current pathway.

In addition, the upper surfaces of the second metallic layers 32n and 32p grown by plating can be further flattened by a plurality of first metallic layers 31n and 31p densely arranged so as to reduce the interval between the first metallic layers in the horizontal direction.

Moreover, first metallic layers 31n and 31p may be formed substantially over the entire region of the openings 22n and 22p of the second resin layer 22 in planar view so that the first metallic layers 31n and 31p are continuous within the n-side and the p-side, respectively, except for the region immediately above the first exposed part 12b, and the like. With this formation, the upper surfaces of the second metallic layers 32n and 32p can be formed in a further flat fashion.

In addition, in the example shown in FIG. 12A, the upper surfaces of the second metallic layers 32n and 32p are formed to be flattened surfaces, and formed to be entirely lower than the upper surface of the second resin layer 22, but not to be considered limited to this example. The upper surfaces of the second metallic layers 32n and 32p may be formed to make some part protrude from the upper surface of the second resin layer 22 and other part lower than the upper surface of the second resin layer 22. In addition, the upper surfaces of the second metallic layers 32n and 32p may be formed in a flat fashion, or uneven.

Figure 12B:
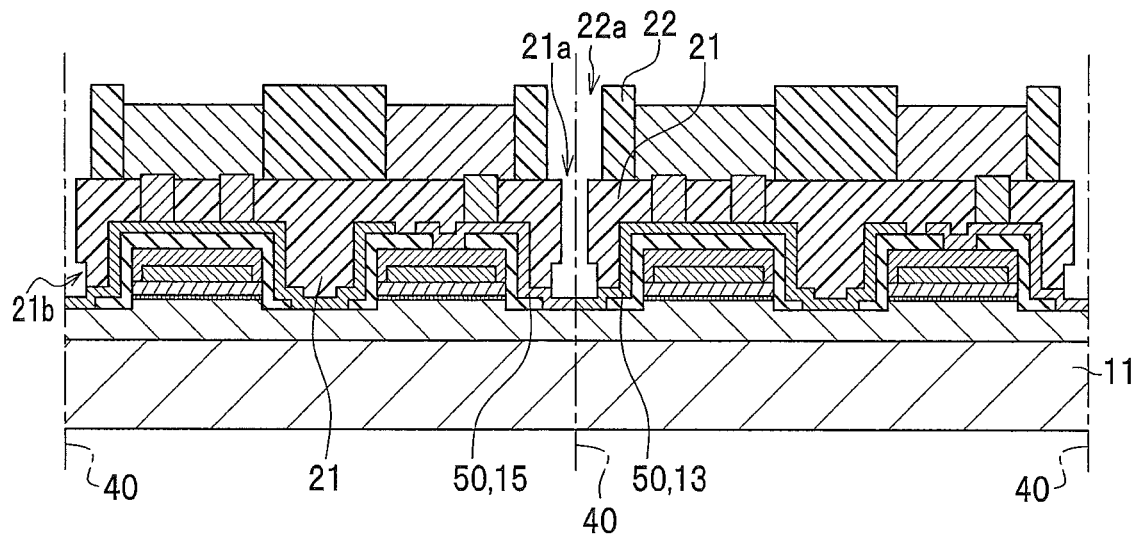

Next, in the mask removal step S112, as shown in FIG. 12B, the mask 33 is removed with the use of an appropriate solvent or agent. Further, the mask 33 can be also removed by dry etching.

The removal of the mask 33 exposes the metallic layer 50 formed in the region along the boundary line 40 at the bottom of the opening 21a of the first resin layer 21. In addition, the removal of the mask 33 forms the difference 21b at the lower side surface of the first resin layer 21.

Figure 13A:
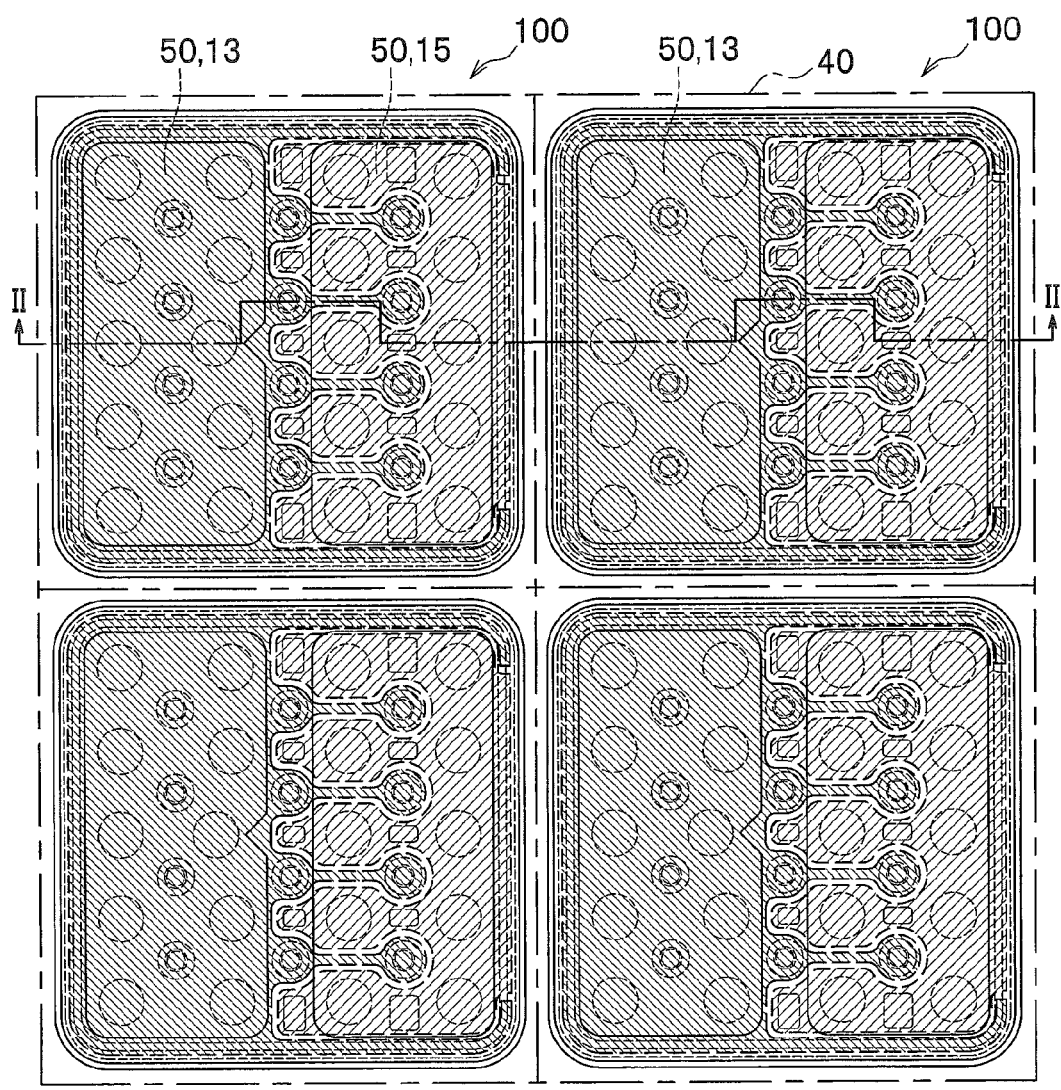
FIGS. 13A and 13B are schematic views illustrating a pad electrode separation step in a process of manufacturing the light-emitting device according to the first embodiment of the present invention, where
Figure 13B:
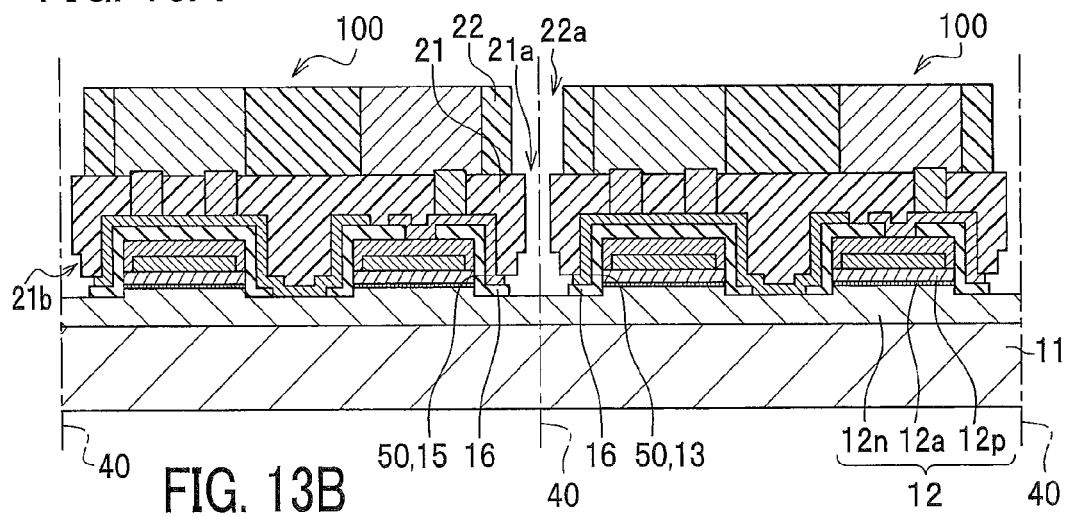

Next, in the pad electrode separation step (electrode separation step) S113, as shown in FIGS. 13A and 13B, the metallic layer 50 exposed at the bottom of the opening 21a of the first resin layer 21 is removed by etching. This removal separates the metallic layer 50 for each light-emitting device 100, and the region which serves as the n-side electrode 13 and the region which serves as the p-type electrode 15 are also separated in each light-emitting device 100.

It is to be noted that for etching the metallic layer 50, a mask may be provided on the upper surfaces of the second metallic layers 32n and 32p so as to keep the second metallic layers 32n and 32p from being etched. In addition, when the second metallic layers 32n and 23p are substantially thicker as compared with the metallic layer 50, the metallic layer 50 may be etched without providing any mask on the upper surfaces of the second metallic layers 32n and 32p, regardless of the decrease in the thickness of the second metallic layers 32n and 32p by an amount comparable to the thickness of the metallic layer 50.

Figure 14:
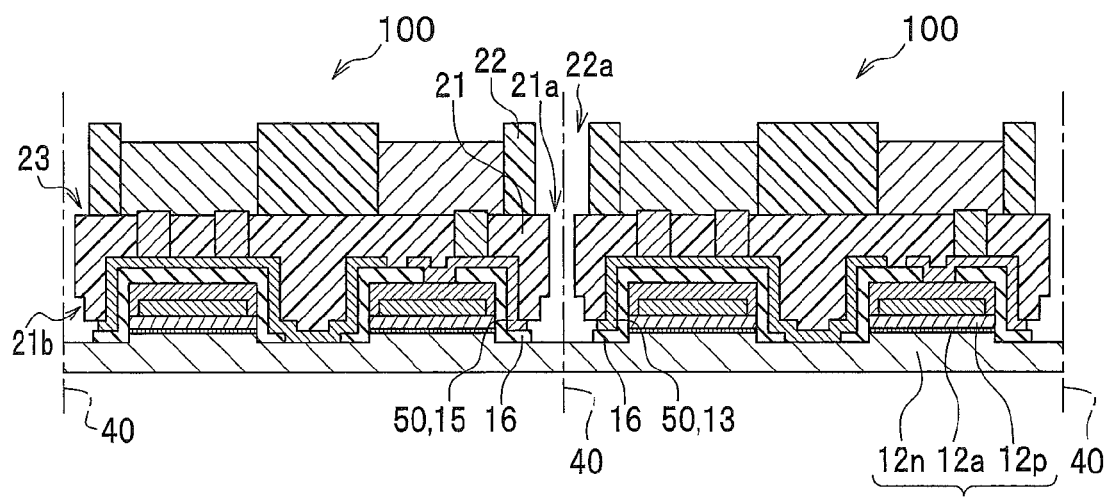
FIG. 14 is a schematic cross-sectional view illustrating a growth substrate removal step in a process of manufacturing the light-emitting device according to the first embodiment of the present invention.

Next, in the growth substrate removal step S114, as shown in FIG. 14, the growth substrate 11 is removed through peeling by a LLO (Laser Lift Off) method, a chemical liftoff method, or the like.

It is to be noted that the growth substrate removal step S114 is not an essential step, but the growth substrate 11 may be left without being peeled. Alternatively, in place of peeling the growth substrate 11, the lower side of the substrate 11 may be polished to reduce the thickness.

In addition, after peeling the growth substrate 11, the lower surface of the semiconductor stacked body 12 may be subjected to wet etching to be uneven.

Furthermore, after peeling the growth substrate 11, or without peeling the growth substrate 11, the lower side of the light-emitting device 100, which serves as a light extraction surface, may be provided with a fluorescent substance layer containing a fluorescent substance that converts the wavelength of light emitted by the light-emitting element 1.

Next, in the division step S115, the light-emitting devices 100 are divided by cutting the wafer along the boundary line 40 shown in FIG. 14 by a dicing method or a scribing method. The side surface formed by the division, which serves as an outer edge of the semiconductor stacked body 12, is exposed without being coated with either the interlayer insulating film 16 or the first resin layer 21, as shown in FIG. 1B.

It is to be noted that the division can be easily achieved just by cutting the semiconductor stacked body 12, because the first resin layer 21 and the second resin layer 22 are formed separately for each light-emitting device 100, so as to have the opening 21a and the opening 22a in the region along the boundary line 40.

Modification Example of First Embodiment

Next, a light-emitting device according to a modification example the first embodiment of the present invention will be described with reference to FIGS. 15A and 15B and FIG. 16.

Configuration of Light-Emitting Device

Figure 15A:
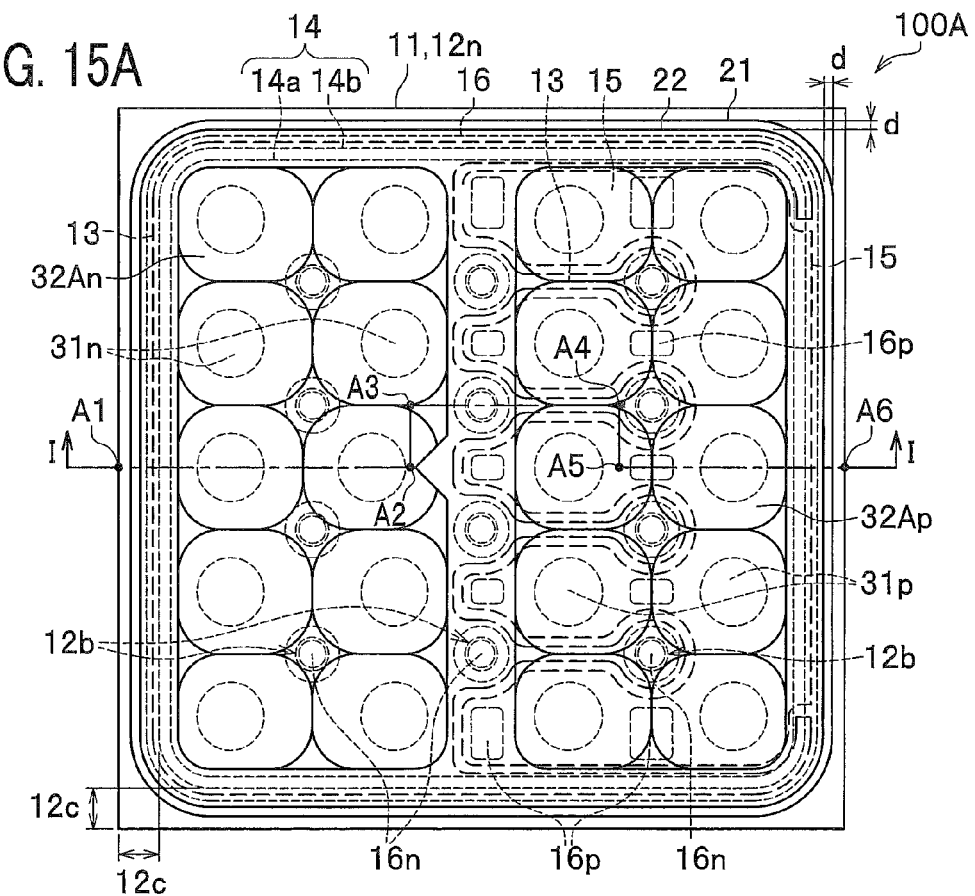
FIGS. 15A and 15B are schematic views illustrating the configuration of a light-emitting device according to a modification example of the first embodiment of the present invention, where
Figure 15B:
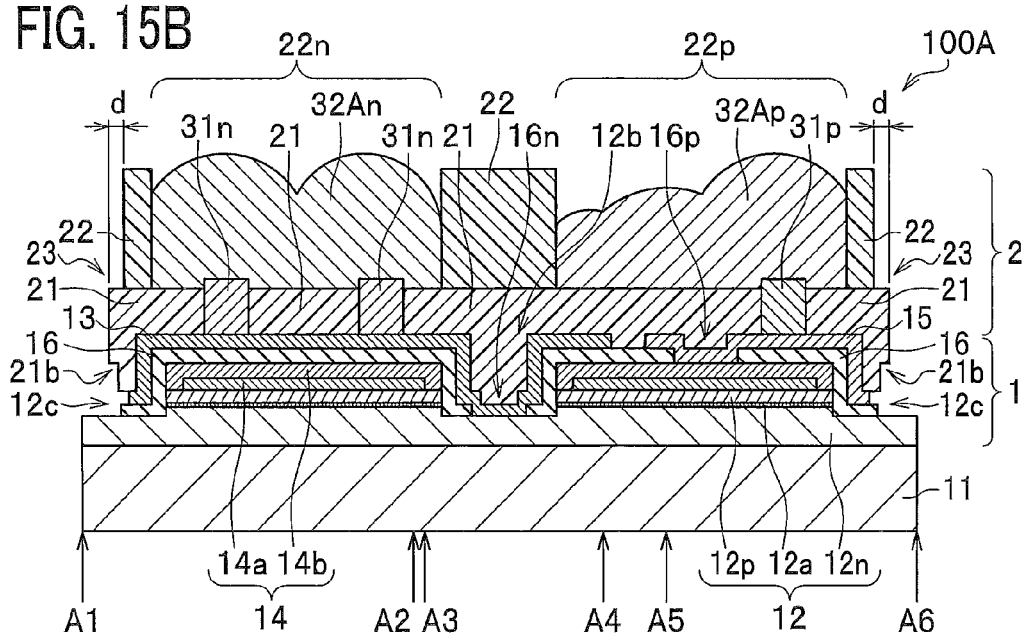
Figure 16:
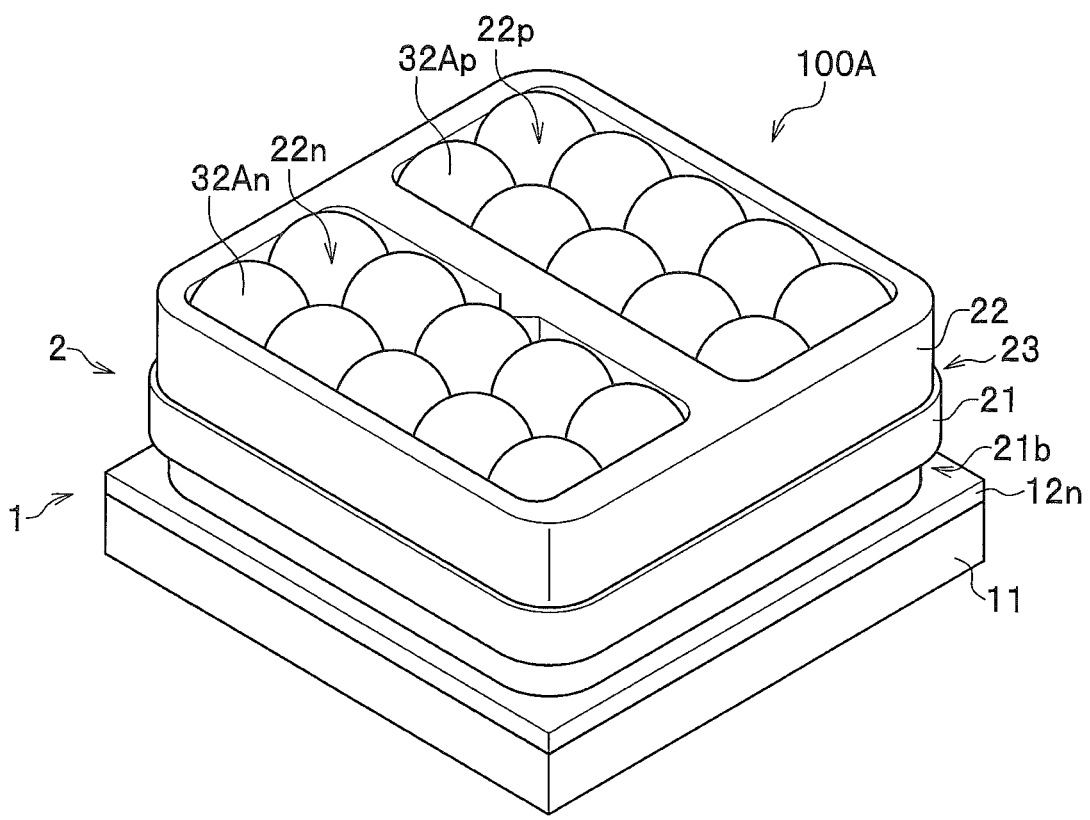
FIG. 16 is a schematic perspective view illustrating the configuration of the light-emitting device according to the modification example of the first embodiment of the present invention.

As shown in FIGS. 15A and 15B and FIG. 16, the light-emitting device 100A according to the modification example of the first embodiment is configured to include second metallic layers 32An and 32Ap in place of the second metallic layers 32n and 32p in the light-emitting device 100 shown in FIGS. 1A and 1B and FIG. 2, and have the growth substrate 11 on the lower side of the semiconductor stacked body 12. The other configuration of the light-emitting device 100A is the same as that of the light-emitting device 100, and thus denoted by the same reference symbols to appropriately leave out the explanations.

It is to be noted that the light-emitting device 100A according to the modification example is configured to have the growth substrate 11, but may be configured to have the growth substrate 11 removed as in the case of the light-emitting device 100. In addition, a fluorescent substance layer may be provided on the lower surface of the semiconductor stacked body 12 in place of the growth substrate 11, or on the lower side of the growth substrate 11.

The second metallic layers 32An and 32Ap of the light-emitting device 100A have uneven upper surfaces, which are formed to be partially lower than the upper surface of the second resin layer 22, and formed so that the convex upper ends of the uneven shapes are higher than the upper surface of the second resin layer 22.

It is to be noted that the second metallic layers 32An and 32Ap may be formed to make the convex upper ends of the second metallic layers 32An and 32Ap at the same level as, or lower than the upper surface of the second resin layer 22.

When the upper surfaces of the second metallic layers 32An and 32Ap are at least partially made lower than the upper surface of the second resin layer 22, the same advantageous effect as in the previously mentioned light-emitting device 100 can be achieved at the time of mounting.

Specifically, as shown in FIGS. 15A and 15B and FIG. 16, when the second metallic layers 32An and 32Ap have a plurality of substantially hemispherical convex portions adjacent to each other, the levels between the adjacent convex portions, that is, levels of the valleys may be made lower than the level of the upper surface of the second resin layer 22. In this configuration, the adhesive member 93 housed in the parts of the second metallic layers 32An and 32Ap, which are provided to be lower than the upper surface of the second resin layer 22, is surrounded by the second resin layer 22, and the amount of the adhesive member 93 leaked to the outside can be thus reduced.

Furthermore, in accordance with the configuration such that the second metallic layers 32An and 32Ap have uneven upper surfaces, the area of contact between the surfaces of the second metallic layers 32An and 32Ap and the adhesive member 93 is increased at the time of mounting the light-emitting device 100A. For this reason, the adhesion is improved between both the surfaces and the member, and the melted adhesive member 93 can be made less likely to be separated from the surfaces of the second metallic layers 32An and 32Ap. Thus, extrusions of the excessive adhesive member 93a can be prevented more effectively.

The operation of the light-emitting device 100A is the same as that of the light-emitting device 100, and the explanation thereof will be thus left out.

Moreover, the light-emitting device 100A can be manufactured in the same way as the light-emitting device 100, and detailed explanations will be thus left out.

It is to be noted that the uneven upper surfaces of the second metallic layers 32An and 32Ap are formed through growth by plating in accordance with an electrolytic plating method with the first metallic layers 31n and 31p as current pathways, with the first metallic layers 31n and 31p arranged to be discretely exposed at a plurality of points of the bottoms of the openings 22n and 22p of the second resin layer 22 in the second metallic layer formation step S111 described previously. In the electrolytic plating, a plating layer is grown isotropically, that is, in a hemisphere shape from the upper surfaces with the first metallic layers 31n and 31p exposed. For this reason, the second metallic layers 32An and 32Ap are formed in the openings 22n and 22p of the second resin layers 22, respectively, in such a fashion that the same number of balls as the ten first metallic layers 31n and 31p are packed while squeezing the balls.

It is to be noted that the upper surface shapes of the second metallic layers 32An and 32Ap can be varied by appropriately changing the sizes, shapes, number, placement points, etc. of the exposed surfaces of the first metallic layers 31n and 31p from the first resin layer 21.

In addition, the region where the upper surfaces of the second metallic layers 32An and 32Ap are lowered with respect to the upper surface of the second resin layer 22 can be adjusted depending on the concentration of the plating solution, the temperature, the plating time, etc. for carrying out the electrolytic plating.

Further, without going into illustration, the light-emitting devices 100A can be divided by cutting the growth substrate 11 in addition to the semiconductor stacked body 12 along the boundary line 40 (see FIG. 14) by a dicing method, a scribing method, or the like in the division step S115 (see FIG. 7).

Second Embodiment

Next, a light-emitting device according to a second embodiment of the present invention will be described with reference to FIGS. 17A and 17B and FIG. 18.

Configuration of Light-Emitting Device

Figure 17A:
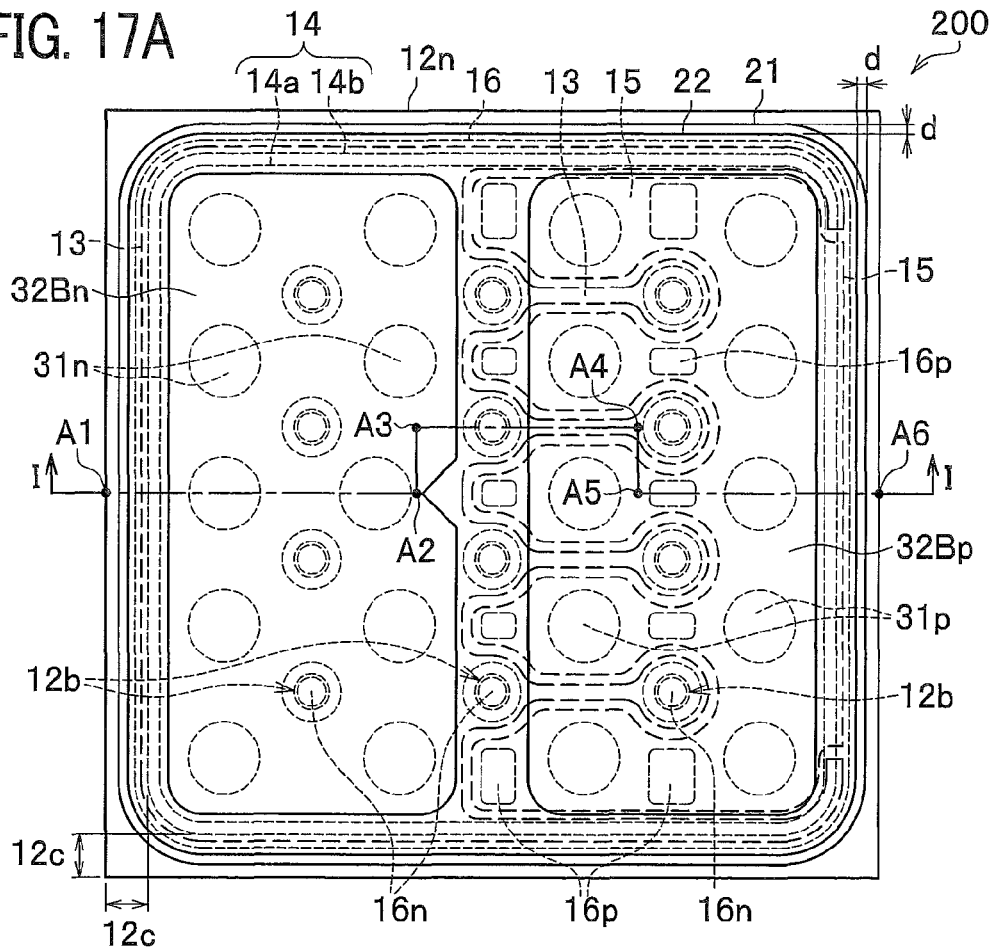
FIGS. 17A and 17B are schematic views illustrating the configuration of a light-emitting device according to a second embodiment of the present invention, where
Figure 17B:
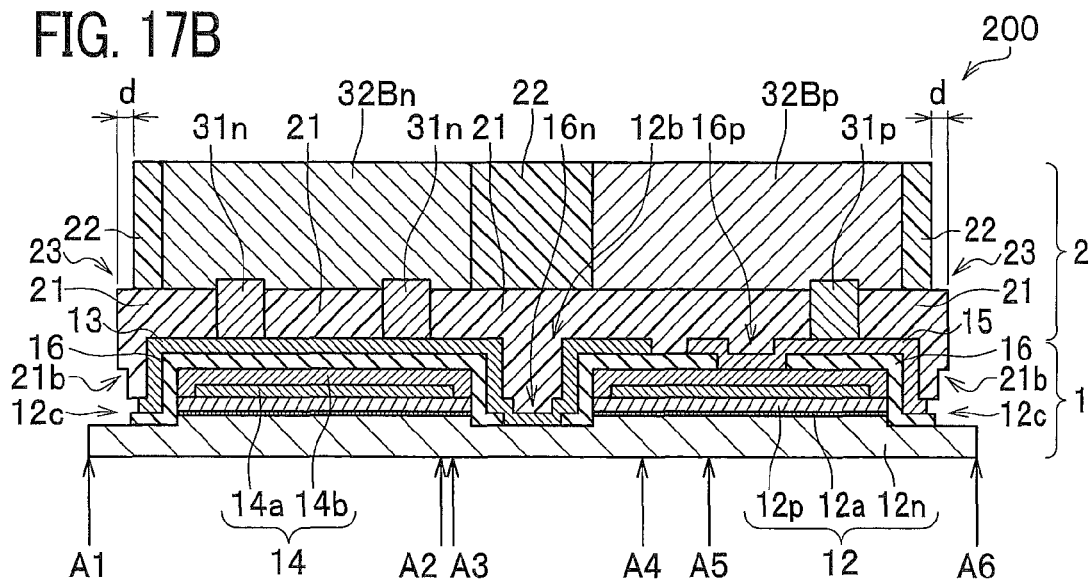
Figure 18:
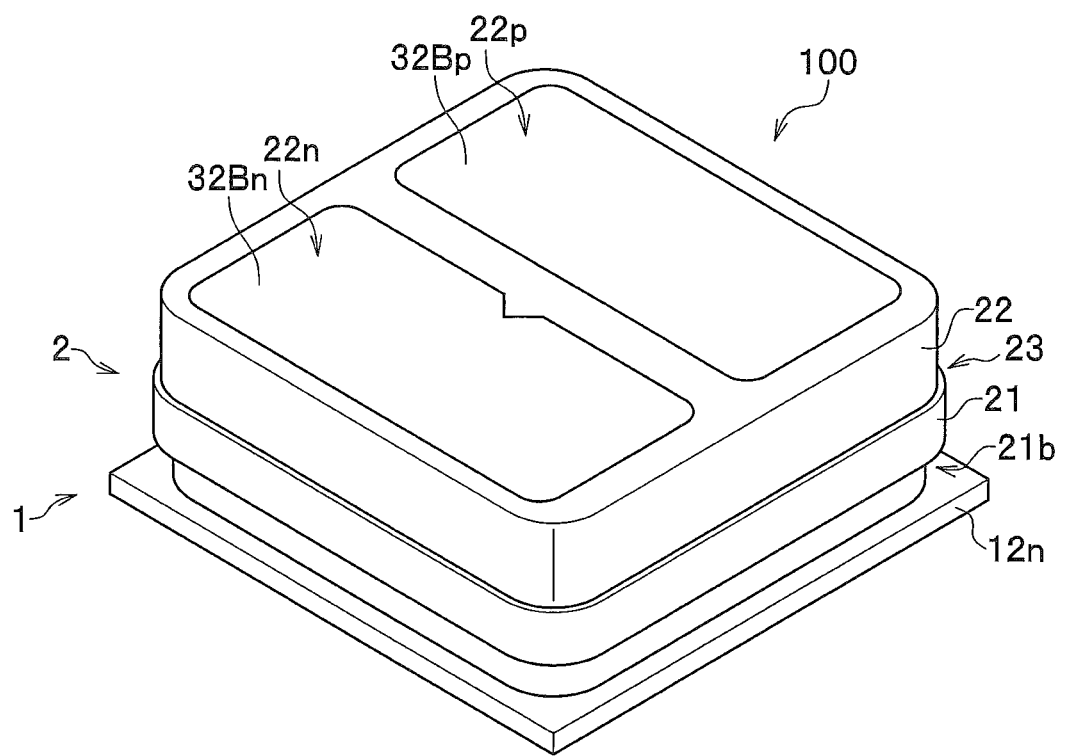
FIG. 18 is a schematic perspective view illustrating the configuration of the light-emitting device according to the second embodiment of the present invention.

As shown in FIGS. 17A and 17B and FIG. 18, the light-emitting device 200 according to the second embodiment includes second metallic layers 32Bn and 32Bp in place of the second metallic layers 32n and 32p in the light-emitting device 100 shown in FIGS. 1A and 1B and FIG. 2. The other configuration of the light-emitting device 200 is the same as that of the light-emitting device 100, and thus denoted by the same reference symbols to appropriately leave out the explanations.

The second metallic layers 32Bn and 32Bp of the light-emitting device 200 are formed to have upper surfaces in the same plane as, that is, at the same level as the upper surface of the second resin layer 22. For this reason, an adhesive member for use in mounting is considered more likely to produce extrusions along the side surface of the second resin layer 22 than in the light-emitting device 100. However, the light-emitting device 200 has the difference 23 between the first resin layer 21 and the second resin layer 22. More specifically, the side surface of the second resin 22 is provided to be located inside the side surface of the first resin layer 21 in planar view. This location can keep the adhesive member from producing extrusions along the side surface of the first resin layer 21 to reach the semiconductor stacked body 12, thereby allowing highly reliable mounting.

Moreover, the side surface of the first resin layer 21 is preferably provided with the difference 21b so that the side surface is located in the inner side in the side of the semiconductor stacked body 12 than in the side of the second resin layer 22. Thus, even when the adhesive member may produce extrusions along the side surface of the first resin layer 21, the adhesive member is trapped by the difference 21b, and can be prevented from further producing extrusions.

The operation of the light-emitting device 200 is the same as that of the light-emitting device 100, and the explanation thereof will be thus left out.

Moreover, the light-emitting device 200 can be manufactured in the same way as the light-emitting device 100, and detailed explanations will be thus left out.

It is to be noted that the second metallic layers 32Bn and 32Bp can be formed through growth by plating in the openings 22n and 22p of the second resin layer 22 until reaching the same level as the upper surface of the second resin layer 22 in the second metallic layer formation step S111 of the method for manufacturing the light-emitting device 100 as shown in FIG. 7. In addition, for the difference 23 between the first resin layer 21 and the second resin layer 22, a photosensitive resin material is provided on the first resin layer 21 in the second resin layer formation step S110. Thereafter, the second resin layer 22 with openings in the region with the first metallic layers 31n and 31p formed, which is placed inside the side surface of the first resin layer 21 in planar view can be formed from a photosensitive resin material by a photolithography method to provide the difference 23.

Modification Example of Second Embodiment

Next, a light-emitting device according to a modification example of the second embodiment of the present invention will be described with reference to FIG. 19.

Configuration of Light-Emitting Device

Figure 19:
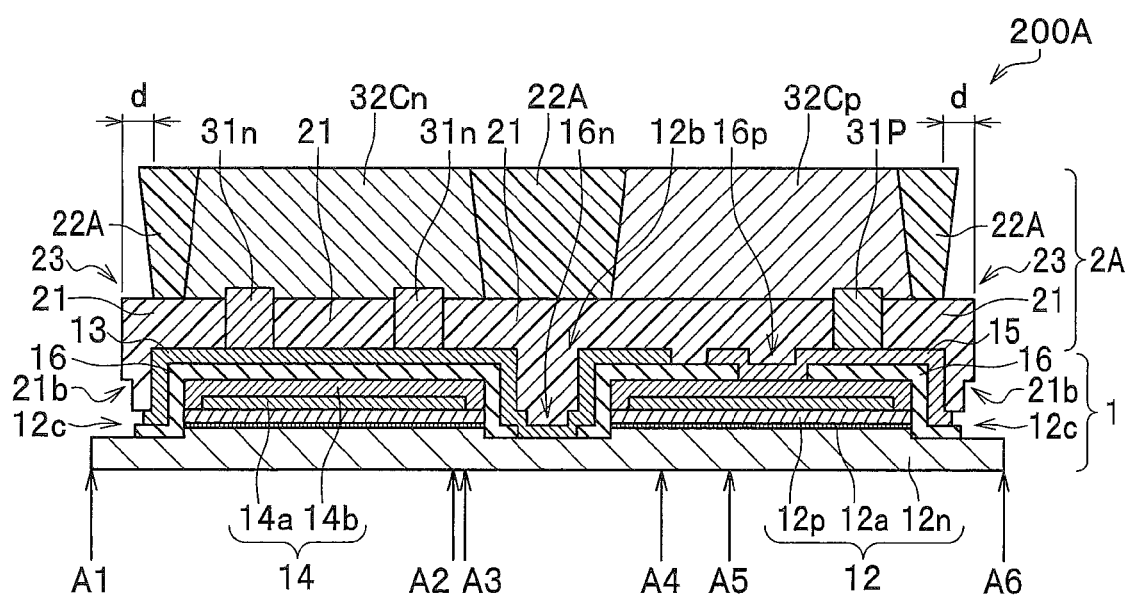
FIG. 19 is a schematic cross-sectional view illustrating the configuration of a light-emitting device according to a modification example of the second embodiment of the present invention.

As shown in FIG. 19, the light-emitting device 200A according to the modification example of the second embodiment includes a support 2A in place of the support 2 in the light-emitting device 200 shown in FIGS. 17A and 17B and FIG. 18. Further, the support 2A includes a second resin layer 22A and second metallic layers 32Cn and 32Cp formed to have side surfaces inclined, in place of the second resin layer 22 and the second metallic layers 32Bn and 32Bp.

The second resin layer 22A has a side surface inclined outwardly toward the mounting surface (toward the upper surfaces of the second metallic layers 32Cn and 32Cp), and a peripheral surface formed in an inverse tapered shape. In addition, the inner surfaces of openings in the second resin layer 22A are also formed similarly in an inverse tapered shape, and the second metallic layers 32Cn and 32Cp are formed in accordance with the shapes of the openings. The other configuration is the same as that of the light-emitting device 200 shown in FIGS. 17A and 17B and FIG. 18, and the explanations will be thus left out.

In the light-emitting device 200A, the second resin layer 22A has a side surface inclined, and the distance along the surface is thus increased from the mounting surface to the semiconductor light-emitting element 1. Therefore, even when an adhesive member such as solder produces extrusions along the side surface of the second resin layer 22A, it becomes hard to reach the semiconductor light-emitting element 1. Furthermore, the angle made by the upper surface of the first resin layer 21 and the side surface of the second resin layer 22A is an acute angle at the difference 23 at the boundary between the second resin layer 22A and the first resin layer 21, and the adhesive member as extrusions produced along the side surface of the second resin layer 22A is easily held up at the difference 23. Accordingly, the light-emitting device 200A is configured to be more effective for preventing the adhesive member from producing extrusions.

It is to be noted that the operation of the light-emitting device 200A is also the same as those of the light-emitting devices 100 and 200, and the explanation thereof will be thus left out.

Method for Manufacturing Light-Emitting Device

For the light-emitting device 200A according to the modification example of the second embodiment, the second resin layer 22A with a side surface inclined in an inverse tapered shape can be formed by a photolithography method with the use of a negative photoresist as a photoresist of photosensitive resin material, in the second resin layer formation step S110 of the method for manufacturing the light-emitting device 100 as shown in FIG. 7.

Furthermore, in the second metallic layer formation step S111 as the next step, the second metallic layers 32Cn and 32Cp are formed to have shapes in accordance with the openings in the second resin layer 22A by electrolytic plating with the n-side electrode 13 and the p-side electrode 15 and the first metallic layers 31n and 31p as seed layers, as in the case of manufacturing the light-emitting device 100.

The light-emitting device 200A can be manufactured by carrying out the other steps in the same manner as the steps for manufacturing the light-emitting device 100, and the explanations will be thus left out.

In this regard, a method will be described for forming the second resin layer 22A by a photolithography method with the use of a negative photoresist in the second resin layer formation step S110.

In this step, first, the negative photoresist is applied over the entire wafer surface. Next, a photomask with an exposure pattern formed is used to expose the area from which the photoresist will not be removed. In this case, the exposure is reduced in the lower layer part, because light is absorbed by the photoresist. In addition, the light beams for the exposure not only propagate in a direction perpendicular to the surface of the photoresist, but also slightly diffuse in the lateral direction. For this reason, the lower layer part near an end of the opening in the region immediately below the opening of the photomask is, due to lack of diffuse components of light beams for irradiating the light-blocking region (non-opening part) of the photomask, short of exposure as compared with the lower layer part near the center of the opening of the photomask.

The negative photoresist has the property that the exposed part undergoes a chemical reaction to become insoluble in the developer. Therefore, near the end of the opening of the photomask, even when the upper layer part of the photoresist is sufficiently exposed, the lower layer part is short of exposure, thereby making it harder to progress the previously mentioned chemical reaction. As a result, the side surface of the resist pattern formed after the development of the photoresist is formed in an inverse tapered shape inclined so that the lower layer part is located inside the upper layer part.

The second resin layer 22A can be formed with the use of a negative photoresist as just described.

While the light-emitting device and manufacturing method therefor according to the present disclosure have been described more specifically with reference to the embodiments of the present invention, the spirit of the present invention is not to be considered limited to the descriptions, but shall be construed broadly in accordance with the claims. Furthermore, the spirit of the present invention obviously encompasses various changes, modifications, etc. in accordance with the descriptions.

A light-emitting device according to a first embodiment of the present invention includes: a semiconductor light-emitting element including a semiconductor stacked body and an electrode provided on one side of the semiconductor stacked body; a first resin layer provided on the side of the semiconductor stacked body; and a second resin layer provided on the first resin layer, the first resin layer includes therein a first metallic layer electrically connected to the electrode, the second resin layer includes therein a second metallic layer electrically connected to the first metallic layer, the second metallic layer has an upper surface exposed from the second resin layer, the upper surface serving as a mounting surface for external connection, and the upper surface of the second metallic layer is at least partially lower in height from the semiconductor stacked body than an upper surface of the second resin layer.

Furthermore, a method for manufacturing the light-emitting device according to the first embodiment of the present invention is a method for manufacturing a light-emitting device including a semiconductor light-emitting element that has a semiconductor stacked body and has an electrode provided on one side of the semiconductor stacked body, the method includes: a wafer preparation step of preparing a wafer formed by arranging a plurality of semiconductor light-emitting elements; a first resin layer formation step of forming, on the one side of the semiconductor stacked body, a first resin layer with an opening on a part of a region with the electrode provided; a first metallic layer formation step of forming a first metallic layer in the opening of the first resin layer; a second resin layer formation step of forming, on the first resin layer, a second resin layer with an opening on a region with the first metallic layer formed; a second metallic layer formation step of forming a second metallic layer in the opening of the second resin layer; and a division step of cutting the wafer along a boundary line between the semiconductor light-emitting elements to divide the semiconductor light-emitting elements, and the second metallic layer is formed so that an upper surface of the second metallic layer is at least partially lower in height from the semiconductor stacked body than an upper surface of the second resin layer.

Furthermore, a light-emitting device according to a second embodiment of the present invention includes: a semiconductor light-emitting element including a semiconductor stacked body and an electrode provided on one side of the semiconductor stacked body; a first resin layer provided on the side of the semiconductor stacked body; and a second resin layer provided on the first resin layer, the first resin layer has therein a first metallic layer electrically connected to the electrode, the second resin layer has therein a second metallic layer electrically connected to the first metallic layer, an upper surface of the second metallic layer is exposed from the second resin layer, and a side surface of the second resin layer is provided to be located inside a side surface of the first resin layer in planar view.

Furthermore, a method for manufacturing the light-emitting device according to the second embodiment of the present invention is a method for manufacturing a light-emitting device including a semiconductor light-emitting element that has a semiconductor stacked body and has an electrode provided on one side of the semiconductor stacked body, the method includes: a wafer preparation step of preparing a wafer formed by arranging a plurality of semiconductor light-emitting elements; a first resin layer formation step of forming, on the one side of the semiconductor stacked body, a first resin layer with an opening on a part of a region with the electrode provided; a first metallic layer formation step of forming a first metallic layer in the opening of the first resin layer; a second resin layer formation step of providing a photosensitive resin material on the first resin layer, and then forming a second resin layer from the photosensitive resin material by a photolithography method, the second resin layer having an opening on a region with the first metallic layer formed, the second resin layer placed inside a side surface of the first resin layer in planar view; a second metallic layer formation step of forming a second metallic layer in the opening of the second resin layer; and a division step of cutting the wafer along a boundary line between the semiconductor light-emitting elements to divide the semiconductor light-emitting elements.

The light-emitting device according to the first embodiment of the present invention has a conductive adhesive member housed in gaps in the openings of the second resin layer, and prevents the adhesive member, for example, solder from being leaked between the second metallic layers and the mounting substrate to the outside in mounting the light-emitting device, by such a configuration that the upper surface of the second metallic layer is at least partially made lower than the upper surface of the second resin layer. As a result, the solder is prevented from producing extrusions along the side surfaces of the first resin layer and second resin layer, thereby making it possible to mount the light-emitting device with high reliability.

Furthermore, in the method for manufacturing a light-emitting device according to the first embodiment of the present invention, a light-emitting device can be manufactured configured as described previously, in which the upper surface of the second metallic layer is at least partially made lower than the upper surface of the second resin layer.

The light-emitting device according to the second embodiment of the present invention can, due to the difference provided between the first resin layer and the second resin layer, block the elevation of the adhesive member along the resin layers from the mounting surface to prevent the member from reaching the semiconductor layers at the time of mounting, thus making it possible to mount the light-emitting device with high reliability.

Furthermore, in the method for manufacturing a light-emitting device according to the second embodiment of the present invention, a light-emitting device can be easily manufactured configured as described previously, with the difference between the first resin layer and the second resin layer.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
   a semiconductor light-emitting element comprising:
      a semiconductor stacked body; and
      an electrode provided on one side of the semiconductor stacked body;
   a first resin layer provided on the one side of the semiconductor stacked body to cover the electrode;
   a first metallic layer provided in the first resin layer and electrically connected to the electrode;
   a second resin layer provided on the first resin layer and having a lower surface in contact with the first resin layer and an upper surface opposite to the lower surface; and
   a second metallic layer provided in the second resin layer and having a metallic lower surface and a metallic upper surface opposite to the metallic lower surface, the metallic lower surface being electrically connected to the first metallic layer, the metallic upper surface being exposed from the second resin layer, the metallic upper surface of the second metallic layer being at least partially lower in height from the semiconductor stacked body than the upper surface of the second resin layer.

2. The light-emitting device according to claim 1, wherein the metallic upper surface of the second metallic layer has an uneven shape.

3. The light-emitting device according to claim 2, wherein the uneven shape has substantially hemispherical convex portions adjacent to each other.

4. The light-emitting device according to claim 3, wherein the substantially hemispherical convex portions adjacent to each other are lower in height from the semiconductor stacked body than the upper surface of the second resin layer.

5. A method for manufacturing a light-emitting device, comprising:
   preparing a wafer including arranged semiconductor light-emitting elements each of which has a semiconductor stacked body and an electrode provided on one side of the semiconductor stacked body;
   providing, on the one side of the semiconductor stacked body, a first resin layer having a first opening;
   providing a first metallic layer in the first opening of the first resin layer to be electrically connected to the electrode;

providing, on the first resin layer, a second resin layer having a second opening, the second resin layer having a lower surface in contact with the first resin layer and an upper surface opposite to the lower surface;

providing a second metallic layer in the second opening of the second resin layer, the second metallic layer having a metallic lower surface and a metallic upper surface opposite to the metallic lower surface, the metallic lower surface being electrically connected to the first metallic layer, the metallic upper surface being exposed from the second resin layer, the metallic upper surface of the second metallic layer being at least partially lower in height from the semiconductor stacked body than the upper surface of the second resin layer; and cutting the wafer along a boundary line between the arranged semiconductor light-emitting elements to divide the arranged semiconductor light-emitting elements.

6. The method according to claim 5,
wherein the first resin layer and the second resin layer are each provided using a photolithography method with a use of a photosensitive resin material in the providing of the first resin layer and the providing of the second resin layer.

7. The method according to claim 5,
wherein the first opening comprises auxiliary openings, the first metallic layer comprises first auxiliary metallic layers, and the second metallic layer comprises second auxiliary metallic layers,
wherein the first resin layer having the auxiliary openings is provided in the providing of the first resin layer,
wherein each of the first auxiliary metallic layers is provided in each of the auxiliary openings of the first resin layer, respectively in the providing of the first metallic layer, and
wherein the second auxiliary metallic layers are provided using an electrolytic plating method with the first auxiliary metallic layers as seed layers in the providing of the second metallic layer.

8. A light-emitting device comprising:
a semiconductor light-emitting element comprising:
    a semiconductor stacked body; and
    an electrode provided on one side of the semiconductor stacked body;
a first resin layer provided on the one side of the semiconductor stacked body to cover the electrode and having a first lower surface in contact with the electrode and a first upper surface opposite to the first lower surface, the first resin layer having a first side surface extending from the first upper surface to the first lower surface;
a first metallic layer provided in the first resin layer and electrically connected to the electrode;
a second resin layer provided on the first resin layer and having a second lower surface in contact with the first upper surface of the first resin layer and a second upper surface opposite to the second lower surface of the second resin layer, the second resin layer having a second side surface extending from the second upper surface to the second lower surface of the second resin layer, the second side surface of the second resin layer being provided inside the first side surface of the first resin layer in planar view; and
a second metallic layer provided in the second resin layer and having a metallic lower surface and a metallic upper surface opposite to the metallic lower surface, the metallic lower surface being electrically connected to the first metallic layer, the metallic upper surface of the second metallic layer being exposed from the second resin layer.

9. The light-emitting device according to claim 8,
wherein the first side surface of the first resin layer is provided with a difference so that the first side surface is located in an inner side in a side of the semiconductor stacked body than in a side of the second resin layer.

10. The light-emitting device according to claim 8,
wherein the semiconductor stacked body has a side surface partially exposed.

11. The light-emitting device according to claim 8,
wherein the second side surface of the second resin layer is inclined outwardly toward the metallic upper surface of the second metallic layer.

12. A method for manufacturing a light-emitting device, the method comprising:
preparing a wafer including arranged semiconductor light-emitting elements each of which has a semiconductor stacked body and has an electrode provided on one side of the semiconductor stacked body;
providing, on the one side of the semiconductor stacked body, a first resin layer having a first opening, a first lower surface in contact with the electrode, and a first upper surface opposite to the first lower surface, the first resin layer having a first side surface extending from the first upper surface to the first lower surface;
providing a first metallic layer in the first opening of the first resin layer to be electrically connected to the electrode;
providing a photosensitive resin material on the first resin layer to provide a second resin layer from the photosensitive resin material using a photolithography method, the second resin layer having a second opening, a second lower surface in contact with the first upper surface of the first resin layer, and a second upper surface opposite to the second lower surface of the second resin layer, the second resin layer having a second side surface extending from the second upper surface to the second lower surface of the second resin layer, the second side surface of the second resin layer being provided inside the first side surface of the first resin layer in planar view;
providing a second metallic layer in the second opening of the second resin layer, the second metallic layer having a metallic lower surface and a metallic upper surface opposite to the metallic lower surface, the metallic lower surface being electrically connected to the first metallic layer, the metallic upper surface of the second metallic layer being exposed from the second resin layer; and
cutting the wafer along a boundary line between the arranged semiconductor light-emitting elements to divide the arranged semiconductor light-emitting elements.

13. The method according to claim 12,
wherein the preparing of the wafer comprises:
stacking an n-type semiconductor layer and a p-type semiconductor layer on a growth substrate to provide the semiconductor stacked body;
providing an entire electrode in a region excluding a boundary region having a predetermined width along the boundary line between the arranged semiconductor light-emitting elements and a predetermined region inside the boundary region, on the p-type semiconductor layer;
removing the p-type semiconductor layer in a region without the entire electrode to expose the n-type semiconductor layer;

providing an insulating film having openings on a part of a surface having the n-type semiconductor layer exposed and a part of an upper surface of the entire electrode; and providing, as the electrode, an n-side electrode electrically connected to a part of the surface having the n-type semiconductor layer exposed, and a p-side electrode electrically connected to a part of the upper surface of the entire electrode.

14. The method according to claim 13,
wherein the n-side electrode and the p-side electrode are provided to be short-circuited in the boundary region in the providing of the n-side electrode and the p-side electrode,
wherein the first metallic layer is provided using an electrolytic plating method with the n-side electrode and the p-side electrode as seed layers in the providing of the first metallic layer, and
wherein the second metallic layer is provided using an electrolytic plating method with the first metallic layer electrically connected to the n-side electrode and the p-side electrode as a seed layer in the providing of the second metallic layer.

15. The method according to claim 13,
wherein providing an insulating mask that coats the n-side electrode and the p-side electrode in the boundary region is carried out after the providing of the n-side electrode and the p-side electrode,
wherein the first resin layer is provided separately for each of the arranged semiconductor light-emitting elements so that an upper surface of the insulating mask is partially exposed along the boundary line in the providing of the first resin layer,
wherein removing the insulating mask is carried out after the providing of the second metallic layer, and
wherein removing the n-side electrode and the p-side electrode in the boundary region is carried out to electrically separating the n-side electrode and the p-side electrode, the n-side electrode and the p-side electrode in the boundary region being exposed from the insulating mask.

16. The method according to claim 12,
wherein the first resin layer is provided using a photolithography method with a use of a photosensitive resin material in the providing of the first resin layer.

* * * * *